US010508335B1

(12) United States Patent
Yilmaz et al.

(10) Patent No.: US 10,508,335 B1
(45) Date of Patent: Dec. 17, 2019

(54) PROCESS FOR PREPARING ELECTROACTIVE MATERIALS FOR METAL-ION BATTERIES

(71) Applicant: Nexeon Limited, Abingdon Oxfordshire (GB)

(72) Inventors: Sefa Yilmaz, Abingdon (GB); Charles Mason, Abingdon (GB); Richard Taylor, Abingdon (GB); David Bent, Abingdon (GB)

(73) Assignee: Nexeon Limited, Abingdon (GB)

( * ) Notice: Subject to any disclaimer, the term of this patent is extended or adjusted under 35 U.S.C. 154(b) by 0 days.

(21) Appl. No.: 16/275,246

(22) Filed: Feb. 13, 2019

(51) Int. Cl.
| H01M 4/38 | (2006.01) |
| H01M 4/134 | (2010.01) |
| C23C 16/04 | (2006.01) |
| C23C 16/24 | (2006.01) |
| H01M 10/05 | (2010.01) |
| H01M 4/36 | (2006.01) |
| H01M 4/02 | (2006.01) |

(52) U.S. Cl.
CPC ............ C23C 16/045 (2013.01); C23C 16/24 (2013.01); H01M 4/366 (2013.01); H01M 4/386 (2013.01); H01M 10/05 (2013.01); *H01M 2004/021* (2013.01)

(58) Field of Classification Search
CPC ...... C23C 16/045; C23C 16/24; H01M 4/366; H01M 4/386; H01M 10/05; H01M 2004/021; H01M 4/134
See application file for complete search history.

(56) References Cited

U.S. PATENT DOCUMENTS

| 5,624,606 | A | 4/1997 | Wilson et al. |
| 5,798,137 | A | 8/1998 | Lord et al. |
| 7,361,431 | B2 | 4/2008 | Kim et al. |
| 7,722,991 | B2 | 5/2010 | Zhang et al. |
| 8,057,900 | B2 | 11/2011 | Luhrs et al. |
| 8,361,659 | B2 | 1/2013 | Richard |
| 8,562,869 | B2 | 10/2013 | Mah et al. |
| 8,673,502 | B2 * | 3/2014 | Petrat ..................... C23C 16/24 429/231.8 |
| 8,778,541 | B2 | 7/2014 | Yamamoto et al. |
| 8,906,555 | B2 | 12/2014 | Hwang et al. |
| 8,945,431 | B2 | 2/2015 | Schulz et al. |
| 9,039,939 | B2 | 5/2015 | Sano |
| 9,373,838 | B2 | 6/2016 | Yushin et al. |
| 9,593,413 | B2 | 3/2017 | Amine et al. |
| 9,876,221 | B2 | 1/2018 | Kim et al. |
| 9,997,784 | B2 | 6/2018 | Su et al. |
| 10,000,425 | B2 | 6/2018 | Le Costaouec et al. |
| 10,128,490 | B2 | 11/2018 | Lee et al. |
| 10,147,950 | B2 | 12/2018 | Sakshaug et al. |
| 10,170,753 | B2 | 1/2019 | Ren et al. |
| 2006/0057355 | A1 | 3/2006 | Suzuki et al. |
| 2011/0309310 | A1 | 12/2011 | Koller et al. |
| 2012/0156493 | A1 | 6/2012 | Maisels |
| 2012/0264020 | A1 | 10/2012 | Burton et al. |
| 2013/0209348 | A1 | 8/2013 | Ludvik |
| 2013/0280601 | A1 | 10/2013 | Geramila |
| 2013/0344391 | A1 | 12/2013 | Yushin et al. |
| 2014/0057179 | A1 | 2/2014 | Yushin et al. |
| 2014/0272592 | A1 | 9/2014 | Thompkins |
| 2015/0321920 | A1 | 11/2015 | Geramila |
| 2016/0104882 | A1 | 4/2016 | Yushin et al. |
| 2016/0298234 | A1 | 10/2016 | Yang |
| 2016/0351894 | A1 | 12/2016 | Wagner et al. |
| 2017/0092950 | A1 | 3/2017 | Xiao et al. |
| 2017/0170477 | A1 | 6/2017 | Sakshaug |
| 2017/0301917 | A1 | 10/2017 | Yuge |
| 2017/0346084 | A1 | 11/2017 | Sakshaug et al. |
| 2018/0151884 | A1 | 5/2018 | Yushin et al. |

(Continued)

FOREIGN PATENT DOCUMENTS

| CN | 102214817 A | 10/2011 |
| CN | 102456876 A | 5/2012 |
| CN | 104577084 A | 4/2015 |

(Continued)

OTHER PUBLICATIONS

Shen et al. "Research progress on silicon/carbon composite anode materials for lithium-ion battery". Journal of Energy Chemistry 27 (2018) 1067-1090. (Year: 2018).*
Zuo et al. "Silicon based lithium-ion battery anodes: A chronicle perspective review". Nano Energy 31 (2017) 113-143. (Year: 2017).*
Bardet et al., "In situ investigation of mesoporous silicon oxidation kinetics using infrared emittance spectroscopy," Phys. Chem. Chem. Phys., 18, 18201-308 (2016).
Cadoret et al., "Silicon Chemical Vapor Deposition on macro and submicron powders in a fluidized bed," Powder Technology, 190(102), 185-91 (2009).
Coppey et al., "Decorated carbon nanotubes by silicon deposition in fluidized bed for Li-ion battery anodes," Chem. Eng. Res. Des. 91, 2491-96 (2013).

(Continued)

*Primary Examiner* — Alexander M Weddle
(74) *Attorney, Agent, or Firm* — McDonnell Boehnen Hulbert & Berghoff LLP

(57) ABSTRACT

The disclosure relates to a process for preparing particulate materials having high electrochemical capacities that are suitable for use as anode active materials in rechargeable metal-ion batteries. In one aspect, the disclosure provides a process for preparing a particulate material comprising a plurality of composite particles. The process includes providing particulate porous carbon frameworks comprising micropores and/or mesopores, wherein the porous carbon frameworks have a $D_{50}$ particle diameter of at least 50 μm; depositing an electroactive material selected from silicon and alloys thereof into the micropores and/or mesopores of the porous carbon frameworks using a chemical vapor infiltration process in a fluidized bed reactor, to provide intermediate particles; and comminuting the intermediate particles to provide said composite particles.

28 Claims, No Drawings

(56) References Cited

U.S. PATENT DOCUMENTS

| | | | |
|---|---|---|---|
| 2018/0331356 A1 | 11/2018 | Feaver | |
| 2018/0342732 A1 | 11/2018 | Troegel et al. | |

FOREIGN PATENT DOCUMENTS

| | | |
|---|---|---|
| CN | 105489891 A | 4/2016 |
| CN | 103840140 B | 12/2017 |
| CN | 107425180 A | 12/2017 |
| CN | 107863513 A | 3/2018 |
| CN | 108428876 A | 8/2018 |
| CN | 109004203 A | 12/2018 |
| DE | 102014211012 A1 | 12/2015 |
| EP | 3 086 388 B1 | 6/2018 |
| JP | 2003100284 A | 4/2003 |
| JP | 4069465 B2 | 4/2008 |
| JP | 5647366 B1 | 12/2014 |
| JP | 6167127 B2 | 7/2017 |
| JP | 6451340 B2 | 1/2019 |
| KR | 101665099 B1 | 10/2016 |
| KR | 20160126857 A | 11/2016 |
| KR | 20180024922 A | 3/2018 |
| KR | 20180078176 A | 7/2018 |
| KR | 101898110 B1 | 9/2018 |
| WO | WO 200227822 A1 | 4/2002 |
| WO | WO 2012097969 A1 | 7/2012 |
| WO | WO 2016116323 A1 | 7/2016 |
| WO | WO 2017040299 A1 | 3/2017 |
| WO | WO 2018165610 Al A1 | 9/2018 |
| WO | WO 2018166735 Al A1 | 9/2018 |

OTHER PUBLICATIONS

Curdts et al., "Upscaling the chemical vapour infiltration process of activated carbon with Tms," Physics Procdia, 46, 248-54 (2013).

Wilson et al., "Lithium Insertion in Carbons Conatining Nanodispersed Silicon," J. Electrochem. Soc., 142(2), 326-332 1995).

Delhaes, "Chemical vapor deposition and infiltration processes of carbon materials," Carbon, 40, 641-657, (2002).

Holzapfel et al., "A new type of nano-sized silicon/carbon composite electrode for reversible lithium insertion," Chem. Commun., 1566-68 (2005).

Holzapfel et al. "ChemicalMaterial as Negative Electrode for Lithium-Ion Batteries," Electrochem. And Sol. State Lett., 8(10), A516-520 (2005).

Holzapfel et al., "Nano silicon for lithium-ion batteries," Electrochem. Acta, 52, 973-78 (2006).

Jaumann et al., "Dichlorosilane-Derived Nano-Silicon inside Hollow Carbon Spheres as High-Performance Anode in Li-Ion Batteries," J. Mater. Chem. A, 5, 9262-9271 (2017).

Jaumann et al.," SEI-component formation on sub 5 nm sized silicon nanoparticles in Li-ion batteries: the role of electrode preparation, FEC addition and binders," Phys. Chem. Chem. Phus., 17(38), 24956-67 (2015).

Kaae, J. L., "Coating of small particles by chemical vapor deposition while the particles are fluidized," Mat. Res. Soc. Symp. Proc. 372, 139 (1995).

Krzeminski et al., "Silicon dry oxidation kinetics at low temperature in the nanometric range: modeling and experiment," arXiv:1106.3160v1, available at https://arxiv.org/pdf/1106.3160v1.pdf, 54 pages (2011).

Magasinksi et al., "High-performance lithium-ion anodes using a hierachical bottom-up approach," Nature Materials, 9 (4), 352-58 (2010).

Kouadri-Mostefa et al., "Silicon Chemical Vapor Deposition (CVD) on microporous powders in a fluidized bed," Powder Technology, 120, 82-87 (2001).

Pflitsch et al., "Chenmical vapor infiltration of activated carbon with tetramethylsilate," Carbon, 79(1), 28-35 (2014).

Reuge et al.,"Modeling of Silicon CVD into Agglomerates of Sub/micrometersiz Particles in a Fluidized Bed," Chem. Vap. Deposition 17, 305-311 (2011).

Saito et al., "Solution combustion synthesis of porous Sn—C composite as anode material for lithium ion batteries," Adv. Powder. Tech., 27,1730-37 (2016).

Vahlas et al., "Principles and applications of CVD powder technology," Mat. Sci. And Eng., R53, 1-72 (2006).

Wang et al., "Chemical vapor deposition and atomic layer deposition for advanced lithium ion batteries and supercapacitors," Energy & Env. Sci., 8, 1889-2014 (2015).

Wang et al., "Facile Preparation of Hierarchically Porous Carbon Monoliths with Well-Ordered Mesostructures," Chem. Mater.,18, 6373-6381 (2006).

Wang et al.,"Synthesis of monolithic 3D ordered macroporous carbon/nano-silicon composites by diiodosilane decomposition," Carbon, 46, 1702-1710 (2008).

Wilson et al., "Carbonaceous Materials Containing Silicon As Anodes for Lithium-Ion Cells," Mat. Res. Soc. Symp. Proc., vol. 393, 305 (1995).

Wilson et al., "Nanodispersed silicon in pregraphitic Carbons," J. Appl. Lett. Phys., 77, 2363-69 (1995).

Yano et al. "Novel method to incorporate Si into monodispersed mesoporous carbon spheres," J. Colloid and Int. Sci., 479, 20-24 (2016).

Yano et al., "Incorporation of silicon into monodispersed starburst carbon spheres with LVD method," Microporous and Mesoporous Mat., 247, 46-51 (2017).

Zhang et al.,"Tin-Nanoparticles Encapsulated in Elastic Hollow Carbon Spheres," Adv. Mater. 20, 1160-1165 (2008).

Search and Examination Report issued in co-pending Great Britain Patent Application No. GB1818232.9, dated Dec. 24, 2018, 9 pages.

Search and Examination Report issued in co-pending Great Britain Patent Application No. GB1818235.2, dated Dec. 24, 2018, 9 pages.

Search and Examination Report issued in co-pending Great Britain Patent Application No. GB1820742.3, dated Jan. 9, 2019, 9 pages.

Co-Pending U.S. Appl. No. 16/247,182, filed Jan. 14, 2019.

Co-Pending U.S. Appl. No. 16/274,185, filed Feb. 12, 2019.

Co-Pending U.S. Patent Application No. 16/275,187, filed Feb. 13, 2019.

U.S. Appl. No. 16/274,187, Notice of Allowance, dated May 9, 2019.

U.S. Appl. No. 16/274,182, Office Action, dated May 20, 2019.

* cited by examiner

US 10,508,335 B1

PROCESS FOR PREPARING ELECTROACTIVE MATERIALS FOR METAL-ION BATTERIES

CROSS-REFERENCE TO RELATED APPLICATIONS

This application claims the benefit of priority of United Kingdom Patent Application no. GB1821011.2, filed Dec. 21, 2018, which is hereby incorporated herein by reference in its entirety.

BACKGROUND OF THE INVENTION

Field

This invention relates in general to electroactive materials that are suitable for use in electrodes for rechargeable metal-ion batteries, and more specifically to a process for preparing particulate materials having high electrochemical capacities that are suitable for use as anode active materials in rechargeable metal-ion batteries.

Technical Background

Rechargeable metal-ion batteries are widely used in portable electronic devices such as mobile telephones and laptops and are finding increasing application in electric or hybrid vehicles. Rechargeable metal-ion batteries generally comprise an anode layer, a cathode layer, an electrolyte to transport metal ions between the anode and cathode layers, and an electrically insulating porous separator disposed between the anode and the cathode. The cathode typically comprises a metal current collector provided with a layer of metal ion containing metal oxide based composite, and the anode typically comprises a metal current collector provided with a layer of an electroactive material, defined herein as a material which is capable of inserting and releasing metal ions during the charging and discharging of a battery. For the avoidance of doubt, the terms "cathode" and "anode" are used herein in the sense that the battery is placed across a load, such that the cathode is the positive electrode and the anode is the negative electrode. When a metal-ion battery is charged, metal ions are transported from the metal-ion-containing cathode layer via the electrolyte to the anode and are inserted into the anode material. The term "battery" is used herein to refer both to a device containing a single anode and a single cathode and to devices containing a plurality of anodes and/or a plurality of cathodes.

There is interest in improving the gravimetric and/or volumetric capacities of rechargeable metal-ion batteries. The use of lithium-ion batteries has already provided a substantial improvement when compared to other battery technologies, but there remains scope for further development. To date, commercial lithium-ion batteries have largely been limited to the use of graphite as an anode active material. When a graphite anode is charged, lithium intercalates between the graphite layers to form a material with the empirical formula $Li_xC_6$ (wherein x is greater than 0 and less than or equal to 1). Consequently, graphite has a maximum theoretical capacity of 372 mAh/g in a lithium-ion battery, with a practical capacity that is somewhat lower (ca. 340 to 360 mAh/g). Other materials, such as silicon, tin and germanium, are capable of intercalating lithium with a significantly higher capacity than graphite but have yet to find widespread commercial use due to difficulties in maintaining sufficient capacity over numerous charge/discharge cycles.

Silicon in particular has been identified as a promising alternative to graphite for the manufacture of rechargeable metal-ion batteries having high gravimetric and volumetric capacities because of its very high capacity for lithium (see, for example, Insertion Electrode Materials for Rechargeable Lithium Batteries, Winter, M. et al. in Adv. Mater. 1998, 10, No. 10). At room temperature, silicon has a theoretical maximum specific capacity in a lithium-ion battery of about 3600 mAh/g (based on $Li_{15}Si_4$). However, the use of silicon as an anode material is complicated by large volumetric changes on charging and discharging.

Intercalation of lithium into bulk silicon leads to a large increase in the volume of the silicon material, up to 400% of its original volume when silicon is lithiated to its maximum capacity, and repeated charge-discharge cycles cause significant mechanical stress in the silicon material, resulting in fracturing and delamination of the silicon anode material. Volume contraction of silicon particles upon delithiation can result in a loss of electrical contact between the anode material and the current collector. A further difficulty is that the solid electrolyte interphase (SEI) layer that forms on the silicon surface does not have sufficient mechanical tolerance to accommodate the expansion and contraction of the silicon. As a result, newly exposed silicon surfaces lead to further electrolyte decomposition and increased thickness of the SEI layer and irreversible consumption of lithium. These failure mechanisms collectively result in an unacceptable loss of electrochemical capacity over successive charging and discharging cycles.

A number of approaches have been proposed to overcome the problems associated with the volume change observed when charging silicon-containing anodes. The most widespread approach to address the irreversible capacity loss of silicon-containing anodes is to use some form of finely structured silicon as the electroactive material. It has been reported that fine silicon structures below around 150 nm in cross-section, such as silicon films and silicon nanoparticles are more tolerant of volume changes on charging and discharging when compared to silicon particles in the micron size range. However, neither of these is particularly suitable for commercial scale applications in their unmodified form; nanoscale particles are difficult to prepare and handle and silicon films do not provide sufficient bulk capacity. For example, nanoscale particles tend to form agglomerates, making it difficult to obtain a useful dispersion of the particles within an anode material matrix. In addition, the formation of agglomerates of nanoscale particles results in an unacceptable capacity loss on repeated charge-discharge cycling.

It is also known in general terms that electroactive materials such as silicon may be deposited within the pores of a porous carrier material, such as an activated carbon material. These composite materials provide some of the beneficial charge-discharge properties of nanoscale silicon particles while avoiding the handling difficulties of nanoparticles. For instance, Guo et al. (Journal of Materials Chemistry A, 2013, pp. 14075-14079) discloses a silicon-carbon composite material in which a porous carbon substrate provides an electrically conductive framework with silicon nanoparticles deposited within the pore structure of the substrate with uniform distribution. SEI formation over the initial charging cycles is confined to the remaining pore volume such that the remaining silicon is not exposed to the electrolyte in subsequent charging cycles. It is shown that the composite material has improved capacity retention over multiple charging cycles, however the initial capacity of the composite material in mAh/g is significantly lower than for silicon nanoparticles.

JP2003100284 discloses an active material comprising a carbon-based scaffold with small pores branching off from a few larger pores. An electroactive material (e.g. silicon) is indiscriminately located on the walls of both large and small pores and on the external surface of the carbon-based scaffold.

It has been observed that the performance of composite materials comprising a porous carbon framework and an electroactive material such as silicon located within the porous carbon framework can be optimized by using porous carbon frameworks with specific pore structures and a controlled ratio of the electroactive material to the available pore volume. It is believed that a low particle size (e.g. $D_{50}$ below 20 µm) is beneficial for the desired end-use of these composite materials in a metal-ion battery. However, there is a need for manufacturing processes to prepare these composite materials in an efficient and cost-effective manner, in particular such that the materials can be prepared on a large scale for commercial uses.

Chemical vapor infiltration CVI is a process of infiltrating a porous substrate material with an additional phase using a reactive gaseous precursor. The porous substrates are placed on to a perforated metallic plate and the mixture of carrier gases and gaseous precursor is passed through the porous substrate which is held at high temperature. The gaseous precursor undergoes a chemical reaction at high temperature within the pore structure of the substrate material and is deposited on the internal surface of the pore space. The CVI process increases the density of the porous substrate material. CVI is of particular utility since there is very little damage to the geometry of the porous substrate. In addition, a high degree of uniformity in the substrate can be achieved by controlling the purity of the reactive gaseous precursor and the pressure and temperature of infiltration.

It has been identified that chemical vapor infiltration (CVI) can be used to deposit an electroactive material into microporous and/or mesoporous carbon materials to yield a composite material with desirable electrochemical properties. In the present invention, CVI particularly refers to processes in which a gaseous precursor of an electroactive material such as silicon is thermally decomposed on a surface to deposit the elemental form of the electroactive material at the surface, and forming gaseous by-products, which allows for deposition onto internal surfaces, in particular surfaces of pore walls.

Typically, the low diffusivity of gaseous silicon precursors used in CVI of silicon compounds into micro and/or mesopore systems, or other gaseous precursors for other electroactive materials, means that it is necessary to use a kinetically limited (surface reaction limited) deposition regime. However, this adds a number of complications from a processing point of view. A main issue is that in large volume samples and reactor systems for high through-put/large batch and continuous processing, it is difficult to ensure the high thermal homogeneity and mass transfer homogeneity required to preserve a homogeneous deposition rate with respect to reactor location, process time and particle pore system location. Accordingly, it is difficult to use CVI to deposit an electroactive material into pores of a porous carbon framework on a commercially useful scale. There are not believed to be any wide-spread commercial manufacturing processes which process powders in the size range less than 40 µm using CVI as a deposition technique.

Fluidized bed reactors (FBRs) can be used to perform CVI. FBRs have found wide range of applications in the industry. They provide very efficient means of gas-solid contact while providing a uniform temperature distribution in the bed. This is mainly achieved by using a gas flow to fluidize particles and by allowing all surfaces to contact with the reactant gas. In principle, FBRs resolve many of the mass and heat transfer issues discussed above. When fluidization is achieved superior solid-solid and gas-solid mixing is observed, in particular when compared to alternative powder processing solutions for performing CVI such as fixed beds and rotary furnaces.

Particles with respect to their size and density can be grouped together for their fluidization behaviour. These groups are known as Geldart group A, B, C, and D materials. Group A, B and D materials can be fluidized with/without bubbles and slugging behaviours. However, the Geldart C includes low particle size, low density materials and these can be difficult to fluidize because of the cohesive forces present as a result of the low particle size. Low particle size porous carbon powders fall into the category of Geldart group C materials.

FBR-Chemical Vapour Deposition (CVD), including CVI has been used for deposition of various catalytic metals and non-metals on porous and non-porous materials as described in Vahlas et al., Principles and applications of CVD powder technology, Materials Science and Engineering R 53 (2006) 1-72.

However, porous carbon powders which have a size less than 40 µm tend to form large agglomerates when used in FBRs due to the strength of inter-particle cohesive forces at this length-scale. This a problem because the fluidization may only occur as large millimeter-sized sized agglomerates rather than fluidization of the individual particles, which leads to problems associated with the intra-agglomerate mass transfer rate. In addition, there may be no fluidization of the carbon powders but, instead, channeling ("rat-holing") arising from the applied local applied shear forces of the gas flow being insufficient to break the cohesive forces between particles (i.e. the gas finds a way around the powder bed, rather than through it). For these reasons, FBRs have not been considered suitable for use in processes involving carbon powders which have a size less than 40 µm.

SUMMARY OF THE DISCLOSURE

In one aspect, the disclosure provides a process for preparing a particulate material comprising a plurality of composite particles, the process comprising:
 (a) providing particulate porous carbon frameworks comprising micropores and/or mesopores, wherein the porous carbon frameworks have a $D_{50}$ particle diameter of at least 50 µm;
 (b) depositing an electroactive material selected from silicon and alloys thereof into the micropores and/or mesopores of the porous carbon frameworks using a chemical vapour infiltration process in a fluidized bed reactor, to provide intermediate particles; and
 (c) comminuting the intermediate particles to provide said composite particles.

Other aspects will be apparent based on the detailed description below.

DETAILED DESCRIPTION

The present invention utilizes chemical vapor infiltration into a porous carbon powder in a fluidized state, allowing control of the kinetic and thermodynamic conditions of the infiltration reaction and ensuring each porous carbon particle sees a similar chemical and thermal environment. In essence, the present invention treats individual micron scale powders as mini infiltration substrates, reducing the characteristic length-scale for precursor diffusion and reaction and facilitating a transition to a continuous processing for mass production.

In a first aspect, the invention provides a process for preparing a particulate material comprising a plurality of composite particles, the process comprising:
(a) providing particulate porous carbon frameworks comprising micropores and/or mesopores, wherein the porous carbon frameworks have a $D_{50}$ particle diameter of at least 50 μm;
(b) depositing an electroactive material selected from silicon and alloys thereof into the micropores and/or mesopores of the porous carbon frameworks using a chemical vapour infiltration process in a fluidized bed reactor, to provide intermediate particles; and
(c) comminuting the intermediate particles to provide said composite particles.

DETAILED DESCRIPTION

The process of the invention utilizes the advantages of CVI for depositing an electroactive material into pores of a porous carbon framework, thus providing a functional nanostructure comprising the electroactive material within the porous carbon framework. The process also utilizes the advantages of using a FBR to perform CVI. The process also avoids the difficulties of using a FBR with carbon powders of a low particle size since the process uses particulate porous carbon frameworks with a $D_{50}$ particle diameter of at least 50 μm as a starting material. The comminuting step means that the process may be used to provide composite particles a reduced particle size compared to the starting material, which is useful in the desired end-use in metal-ion batteries. In particular, composite particles within a size range below 20 μm are ideally suited for use in composite film negative electrodes (or "anodes") for metal-ion batteries due to their dispersibility in slurries, their structural robustness and their capacity retention over repeated charge-discharge cycles. Such composite films are typically less than 100 μm thick, or less than 50 μm thick and the smaller particle size also helps to achieve denser films of uniform thickness. The process of the invention thus provides an effective process for preparing composite particles which is suitable for large-scale commercial use.

It may appear counterintuitive to prepare composite particles using CVI in a FBR and then to comminute the intermediate particles. In particular, the comminution step may have been expected to damage the functional nanostructure of intermediate particles obtained from the CVI process, namely, the electroactive material deposited within the pores of the carbon framework. However, the inventors have found that comminution may occur without a significant level of damage due to the relative μm-length scale of fracture compared to the nm-length scale of the functional unit of the composite particles. Since the carbon frameworks comprise micropores and/or mesopores, the desired electrochemical properties are retained in the product obtained after the comminution step.

The process of the invention enables the properties of the porous carbon framework starting material to be chosen in order to provide a final product with a desired set of properties. For instance, choosing the porous carbon framework to have a specific pore structure allows the production of a product with a specific micropore and/or mesopore structure since the comminution step may occur without significant damage to the pore structure.

The electroactive material may be silicon or an alloy thereof. Preferably the electroactive material is silicon. The electroactive material may optionally comprise a minor amount of one or more dopants. Suitable dopants include boron and phosphorus, other n-type or p-type dopants, or nitrogen. The silicon alloy may comprise a minor amount of one or more other electroactive materials such as tin, aluminium, and germanium. Preferably, the one or more other electroactive materials are present in a total amount of no more than 2 wt % based on the total amount of the alloy.

For the avoidance of doubt, the term "particle diameter" as used herein refers to the equivalent spherical diameter (esd), i.e. the diameter of a sphere having the same volume as a given particle, wherein the particle volume is understood to include the volume of any intra-particle pores. The terms "$D_{50}$" and "$D_{50}$ particle diameter" as used herein refer to the volume-based median particle diameter, i.e. the diameter below which 50% by volume of the particle population is found. The terms "$D_{10}$" and "$D_{10}$ particle diameter" as used herein refer to the 10th percentile volume-based median particle diameter, i.e. the diameter below which 10% by volume of the particle population is found. The terms "$D_{90}$" and "$D_{90}$ particle diameter" as used herein refer to the 90th percentile volume-based median particle diameter, i.e. the diameter below which 90% by volume of the particle population is found.

The terminology "$D_n$" used herein to define particle diameter distributions should be distinguished from the terminology "$PD_n$" which is used herein to define pore diameter distributions.

Particle diameters and particle size distributions can be determined by routine laser diffraction techniques in accordance with ISO 13320:2009. Laser diffraction relies on the principle that a particle will scatter light at an angle that varies depending on the size the particle and a collection of particles will produce a pattern of scattered light defined by intensity and angle that can be correlated to a particle size distribution. A number of laser diffraction instruments are commercially available for the rapid and reliable determination of particle size distributions. Unless stated otherwise, particle size distribution measurements as specified or reported herein are as measured by the conventional Malvern Mastersizer™ 3000 particle size analyzer from Malvern Instruments. The Malvern Mastersizer™ 3000 particle size analyzer operates by projecting a helium-neon gas laser beam through a transparent cell containing the particles of interest suspended in an aqueous solution. Light rays which strike the particles are scattered through angles which are inversely proportional to the particle size and a photodetector array measures the intensity of light at several predetermined angles and the measured intensities at different angles are processed by a computer using standard theoretical principles to determine the particle size distribution. Laser diffraction values as reported herein are obtained using a wet dispersion of the particles in distilled water. The particle refractive index is taken to be 3.50 and the dispersant index is taken to be 1.330. Particle size distributions are calculated using the Mie scattering model.

Porous Carbon Frameworks

The porous carbon frameworks have a $D_{50}$ particle diameter of at least 50 μm. For an effective and efficient FBR, it is more preferred that the porous carbon frameworks have $D_{50}$ particle diameter of at least 60 μm, more preferably at least 70 µm, most preferably at least 80 µm. Optionally, the porous carbon frameworks have a $D_{50}$ particle diameter of no more than 1000 µm, or no more than 500 µm, or no more than 250 µm, or no more than 150 µm. Optionally, the porous carbon frameworks have a $D_{50}$ particle diameter in the range of 50 to 1000 µm, or in the range of 60 to 500 µm, or in the range of 70 to 250 µm, or in the range of 80 to 150 µm.

Optionally, the porous carbon frameworks have a $D_{10}$ particle diameter of at least 30 µm, at least 40 µm, or at least 50 µm, or at least 60 µm, or at least 70 µm. By maintaining the $D_{10}$ particle diameters above these values the presence of a large number of carbon frameworks with a small particle size which may be unsuitable for FBR is advantageously avoided.

Optionally, the porous carbon frameworks have a $D_{90}$ particle diameter of no more than 1500 µm, or no more than 1000 µm, or no more than 750 µm, or no more than 500 µm, or no more than 200 µm. Optionally, the porous carbon frameworks have a $D_{98}$ particle diameter of no more than 1550 µm, or no more than 1000 µm, or no more than 800 µm, or no more than 550 µm, or no more than 250 µm. By maintaining the $D_{90}$ and/or $D_{98}$ particle diameters below these values the presence of a large number of carbon frameworks with a large particle size which may be unsuitable for CVI is advantageously avoided.

For instance, the porous carbon frameworks may have a $D_{10}$ particle diameter of at least 30 µm, a $D_{50}$ particle diameter of at least 50 µm, and a $D_{90}$ particle diameter of no more than 200 µm. The porous carbon frameworks may have a $D_{10}$ particle diameter of at least 30 µm, a $D_{50}$ particle diameter in the range of 50 to 250 µm, a $D_{90}$ particle diameter of no more than 750 µm, and a $D_{98}$ particle size of no more than 1000 µm. The porous carbon frameworks may have a $D_{10}$ particle diameter of at least 30 µm, a $D_{50}$ particle diameter in the range of 60 to 200 µm, a $D_{90}$ particle diameter of no more than 500 µm, and a $D_{98}$ particle size of no more than 800 µm. The porous carbon frameworks may have a $D_{10}$ particle diameter of at least 40 µm, a $D_{50}$ particle diameter in the range of 60 to 150 µm, and a $D_{90}$ particle diameter of no more than 200 µm, and a $D_{98}$ particle size of no more than 250 µm.

The porous carbon frameworks preferably have a narrow size distribution span. For instance, the particle size distribution span (defined as $(D_{90}-D_{10})/D_{50}$) is preferably 5 or less, more preferably 4 or less, more preferably 3 or less, more preferably 2 or less, and most preferably 1.5 or less. By maintaining a narrow size distribution span, a consistent deposition of the electroactive material into the pores of the carbon frameworks is more readily achievable.

The porous carbon framework suitably comprises a three-dimensionally interconnected open pore network comprising a combination of micropores and/or mesopores and optionally a minor volume of macropores. The term "micropore" is used herein to refer to pores of less than 2 nm in diameter, the term "mesopore" is used herein to refer to pores of 2 to 50 nm in diameter, and the term "macropore" is used to refer to pores of greater than 50 nm and no more than 100 nm in diameter.

References herein to the volume of micropores, mesopores and macropores in the porous carbon framework, and any references to the distribution of pore volume within the porous carbon framework, refer to the internal pore volume of the porous carbon framework taken in isolation (i.e. in the absence of any electroactive material or other materials occupying some or all of the pore volume).

The volume fraction of micropores (based on the total volume of micropores and mesopores) is represented herein by the symbol $\varphi_a$ and the volume fraction of mesopores (based on the total volume of micropores and mesopores) is represented by the symbol $\varphi_b$, and therefore it will be understood that $\varphi_a+\varphi_b=1$.

The porous carbon framework is characterized by a pore volume in the form of micropores and/or mesopores. The total volume of micropores and mesopores (i.e. the total pore volume in the range of 0 to 50 nm) is referred to herein as $P_1$ cm$^3$/g, wherein $P_1$ represents a natural number. The value of $P_1$ may also be to correlate the pore volume to the weight ratio of electroactive material silicon to the porous carbon framework in the final product.

For the avoidance of doubt, $P_1$ as used herein relates to the pore volume of the porous carbon framework when measured in isolation, i.e. in the absence of silicon or any other material occupying the pores of the porous carbon framework. Similarly, the references herein to the volume of micropores, mesopores and macropores in the porous carbon framework, and any references to the distribution of pore volume within the porous carbon framework, refer to the internal pore volume of the porous carbon framework in isolation (i.e. in the absence of any silicon or other materials occupying the pore volume).

The porous carbon frameworks may have a pore volume $P_1$ of at least 0.4.

The porous carbon frameworks may have a pore volume $P_1$ in a range of 0.4 to 0.6. This corresponds to a relatively low pore volume in the form of micropores and/or mesopores.

Alternatively, the porous carbon frameworks may have a pore volume $P_1$ of at least 0.5, or at least 0.6, or at least 0.65, or at least 0.7, or at least 0.75, or at least 0.8, or at least 0.85, or at least 0.9, or at least 0.95, or at least 1, or at least 1.05, or at least 1.1, or at least 1.2. The use of a high porosity carbon framework is advantageous since it allows a larger amount of silicon to be accommodated within the pore structure, and it has been found that high porosity carbon frameworks in which the pore volume is predominantly in the form of micropores and smaller mesopores have sufficient strength to accommodate the volumetric expansion of the electroactive material without fracturing or otherwise degrading the porous carbon framework.

The porous carbon frameworks may have a pore volume $P_1$ of up to 2.5, or up to 2.2, or up to 2, or up to 1.8, or up to 1.6, or up to 1.5, or up to 1.4, or up to 1.3, or up to 1.2. The internal pore volume of the porous carbon framework is suitably capped at a value at which increasing fragility of the porous carbon framework outweighs the advantage of increased pore volume accommodating a larger amount of the electroactive material.

The value of $P_1$ may be in the range of 0.6 to 2.5, or in the range of 0.7 to 2, or in the range of 0.7 to 1.2

The volume fraction of micropores ($\varphi_a$) may be at least 0.1, or in the range of 0.1 to 0.9. Preferably, $\varphi_a$ is greater than 0.6, more preferably greater than 0.8.

A fraction of pores having diameters in the larger mesopore range may be advantageous to facilitate electrolyte access to the electroactive material in the final product. Therefore, pores having a diameter in the range of 10 to 50 nm (i.e. larger mesopores) may optionally constitute up to 1%, up to 2%, up to 5% or up to 10% of the total micropore and mesopore volume of the porous carbon framework.

The pore size distribution of the porous carbon framework may be monomodal, bimodal or multimodal. As used herein, the term "pore size distribution" relates to the distribution of pore size relative to the cumulative total internal pore volume of the porous carbon framework, not only of micropores and mesopores but also of any macropores present. A bimodal or multimodal pore size distribution may be preferred since close proximity between the smallest pores and pores of larger diameter provides the advantage of efficient ionic transport through the porous network to the electroactive material. Accordingly, the composite particles prepared from the porous carbon frameworks have high ionic diffusivity and therefore improved rate performance.

Suitably, a bimodal or multimodal pore size distribution includes a peak pore size in the micropore range and a peak pore size in the mesopore size range which differ from one another by a factor of 5 to 20, more preferably by a factor of about 10. For instance, the porous carbon framework may have a bimodal pore size distribution including a peak at a pore size of 1.5 nm and a peak at a pore size of 15 nm. The porous carbon framework may have a bimodal pore size distribution including a peak at a pore size of 2 nm and a peak at a pore size of 20 nm. The porous carbon framework may have a bimodal pore size distribution including a peak at a pore size of 1.2 nm and a peak at a pore size of 12 nm.

The total volume of micropores and mesopores and the pore size distribution of micropores and mesopores are determined using nitrogen gas adsorption at 77 K using quenched solid density functional theory (QSDFT) in accordance with standard methodology as set out in ISO 15901-2 and ISO 15901-3. Nitrogen gas adsorption is a technique that characterizes the porosity and pore diameter distributions of a material by allowing a gas to condense in the pores of a solid. As pressure increases, the gas condenses first in the pores of smallest diameter and the pressure is increased until a saturation point is reached at which all of the pores are filled with liquid. The nitrogen gas pressure is then reduced incrementally, to allow the liquid to evaporate from the system. Analysis of the adsorption and desorption isotherms, and the hysteresis between them, allows the pore volume and pore size distribution to be determined. Suitable instruments for the measurement of pore volume and pore size distributions by nitrogen gas adsorption include the TriStar II and TriStar II Plus porosity analyzers, which are available from Micromeritics Instrument Corporation, USA.

Nitrogen gas adsorption is effective for the measurement of pore volume and pore size distributions for pores having a diameter up to 50 nm, but is less reliable for pores of much larger diameter. For the purposes of the present invention, nitrogen adsorption is therefore used to determine pore volumes and pore size distributions only for pores having a diameter up to and including 50 nm. As set out above, the value of $P_1$ is determined by taking into account only pores of diameter up to and including 50 nm (i.e. only micropores and mesopores), and the values of $PD_n$ and $\varphi_a$, $\varphi_b$, $\varphi_{20}$, $\varphi_{10}$, and $\varphi_5$ (discussed below) are likewise determined relative to the total volume of micropores and mesopores only.

In view of the limitations of available analytical techniques it is not possible to measure pore volumes and pore size distributions across the entire range of micropores, mesopores and macropores using a single technique. In the case that the porous carbon framework comprises macropores, the volume of pores in the range of greater than 50 nm and up to 100 nm is identified herein with the value of $P_2$ cm$^3$/g and is measured by mercury porosimetry. The value of $P_2$ relates to the pore volume of the porous carbon framework when measured in isolation, i.e. in the absence of an electroactive material or any other material occupying the pores of the porous carbon framework.

For the avoidance of doubt, the value of $P_2$ takes into account only pores having a diameter of greater than 50 nm up to and including 100 nm, i.e. it includes only the volume of macropores up to 100 nm in diameter. Any pore volume measured by mercury porosimetry at pore sizes of 50 nm or below is disregarded for the purposes of determining the value of $P_2$. Pore volume measured by mercury porosimetry above 100 nm is assumed for the purposes of the invention to be inter-particle porosity and is also not taken into account in the measurement of macropores or when determining the value of $P_2$. As set out above, nitrogen adsorption is used to characterize the mesopores and micropores.

Mercury porosimetry is a technique that characterizes the porosity and pore diameter distributions of a material by applying varying levels of pressure to a sample of the material immersed in mercury. The pressure required to intrude mercury into the pores of the sample is inversely proportional to the size of the pores. Values obtained by mercury porosimetry as reported herein are obtained in accordance with ASTM UOP578-11, with the surface tension y taken to be 480 mN/m and the contact angle $\varphi$ taken to be 140° for mercury at room temperature. The density of mercury is taken to be 13.5462 g/cm$^3$ at room temperature. A number of high precision mercury porosimetry instruments are commercially available, such as the AutoPore IV series of automated mercury porosimeters available from Micromeritics Instrument Corporation, USA. For a complete review of mercury porosimetry reference may be made to P. A. Webb and C. Orr in "Analytical Methods in Fine Particle Technology, 1997, Micromeritics Instrument Corporation, ISBN 0-9656783-0.

The volume of macropores (and therefore the value of $P_2$) is preferably small as compared to the volume of micropores and mesopores (and therefore the value of $P_1$). While a small fraction of macropores may be useful to facilitate electrolyte access into the pore network, the advantages of the invention are obtained substantially by accommodating silicon in micropores and smaller mesopores.

Thus, in accordance with certain embodiments of the invention the total volume of macropores in the porous carbon framework is $P_2$ cm$^3$/g as measured by mercury porosimetry, wherein $P_2$ preferably has a value of no more than $0.2 \times P_1$, or no more than $0.1 \times P_1$, or no more than $0.05 \times P_1$, or no more than $0.02 \times P_1$, or no more than $0.01 \times P_1$, or no more than $0.005 \times P_1$.

$P_2$ preferably has a value of no more than 0.3, or no more than 0.25, or no more than 0.20, or no more than 0.15, or no more than 0.1, or no more than 0.05. As discussed above in relation to larger mesopores, a small pore volume fraction in the macropore range may be advantageous to facilitate electrolyte access to the electroactive material in the final product.

The open pore network optionally includes a hierarchical pore structure, i.e. a pore structure in which there is a degree of ordering of pore sizes, with smaller pores branching from larger pores.

It will be appreciated that intrusion techniques such as gas adsorption and mercury porosimetry are effective only to determine the pore volume of pores that are accessible to nitrogen or to mercury from the exterior of the porous carbon framework. Porosity values ($P_1$ and $P_2$) as specified herein shall be understood as referring to the volume of open pores, i.e. pores that are accessible to a fluid from the exterior of the porous carbon framework. Fully enclosed pores which cannot be identified by nitrogen adsorption or mercury porosimetry shall not be taken into account herein when specifying porosity values. Likewise, any pore volume located in pores that are so small as to be below the limit of detection by nitrogen adsorption is not taken into account for determining the value of $P_1$.

The porous carbon framework may comprise crystalline carbon or amorphous carbon, or a mixture of amorphous and crystalline carbon. The porous carbon framework may be either a hard carbon or soft carbon framework and may suitably be obtained by known procedures involving the pyrolysis of polymers or organic matter.

As used herein, the term "hard carbon" refers to a disordered carbon matrix in which carbon atoms are found predominantly in the $sp^2$ hybridized state (trigonal bonds) in nanoscale polyaromatic domains. The polyaromatic domains are cross-linked with a chemical bond, e.g. a C—O—C bond. Due to the chemical cross-linking between the polyaromatic domains, hard carbons cannot be converted to graphite at high temperatures. Hard carbons have graphite-like character as evidenced by the large G-band (~1600 cm-1) in the Raman spectrum. However, the carbon is not fully graphitic as evidenced by the significant D-band (~1350 cm-1) in the Raman spectrum.

As used herein, the term "soft carbon" also refers to a disordered carbon matrix in which carbon atoms are found predominantly in the $sp^2$ hybridized state (trigonal bonds) in polyaromatic domains having dimensions in the range of 5 200 nm. In contrast to hard carbons, the polyaromatic domains in soft carbons are associated by intermolecular forces but are not cross-linked with a chemical bond. This means that they will graphitize at high temperature. The porous carbon framework preferably comprises at least 50% $sp^2$ hybridized carbon as measured by XPS. For example, the porous carbon framework may suitably comprise from 50% to 98% $sp^2$ hybridized carbon, from 55% to 95% $sp^2$ hybridized carbon, from 60% to 90% $sp^2$ hybridized carbon, or from 70% to 85% $sp^2$ hybridized carbon.

A variety of different polymeric materials may be used to prepare suitable porous carbon frameworks. Examples of polymeric materials which form porous carbon frameworks on pyrolysis include phenolic resins, novolac resins, pitch, melamines, polyacrylates, polystyrenes, polyvinylalcohol (PVA), polyvinylpyrrolidone (PVP), and various copolymers comprising monomer units of acrylates, styrenes, α-olefins, vinyl pyrrolidone and other ethylenically unsaturated monomers. A variety of different hard carbon materials are available in the art depending on the starting material and the conditions of the pyrolysis process.

The porous carbon framework may undergo a chemical or gaseous activation process to increase the volume of mesopores and micropores. A suitable activation process comprises contacting pyrolyzed carbon with one or more of oxygen, steam, CO, $CO_2$ and KOH at a temperature in the range of 600 to 1000° C.

Mesopores can also be obtained by known templating processes, using extractable pore formers such as MgO and other colloidal or polymer templates which can be removed by thermal or chemical means post pyrolysis or activation.

The term "BET surface area" as used herein should be taken to refer to the surface area per unit mass calculated from a measurement of the physical adsorption of gas molecules on a solid surface, using the Brunauer-Emmett-Teller theory, in accordance with ISO 9277.

Optionally, the porous carbon frameworks have a BET surface area of at least 750 $m^2/g$, or at least 1000 $m^2/g$, or at least 1250 $m^2/g$, or at least 1500 $m^2/g$. Optionally, the porous carbon frameworks have a BET surface area of no more than 4000 $m^2/g$, or no more than 3500 $m^2/g$, or no more than 3250 $m^2/g$, or no more than 3000 $m^2/g$. The porous carbon frameworks preferably have a BET surface area of 1500 to 3000 $m^2/g$.

As discussed above, the inventors have recognised that since the carbon frameworks comprise micropores and/or mesopores, when comminuted the desired properties are retained in the product. Accordingly, the invention allows for the desired properties of the composite particle product to be targeted by controlling the pore structure of the porous carbon frameworks. Certain classes of porous carbon frameworks are discussed below and can be utilised in the invention to provide certain classes of composite particle product. It will be understood that the features of the classes of porous carbon frameworks discussed below are to be considered in combination with the features of the porous carbon frameworks discussed above, such as the particle size.

Porous Carbon Frameworks 1

Porous carbon frameworks 1 are characterized by a high pore volume in the form of micropores and/or mesopores. More preferably, the value of $P_1$ is at least 0.75, more preferably at least 0.8, at least 0.85, more preferably at least 0.9, more preferably at least 0.95, more preferably at least 1, for example at least 1.05, at least 1.1, at least 1.15, or at least 1.2.

In general, the value of $P_1$ of a porous carbon framework 1 may be up to 2.5. However, more preferably, the value of $P_1$ may be up to 2.2, or up to 2, or up to 1.8, or up to 1.6, or up to 1.5, or up to 1.4, or up to 1.3.

In accordance with porous carbon frameworks 1, the value of $P_1$ may be, for instance, in the range of 0.7 to 2.5 (i.e. a total volume of micropores and mesopores of 0.7 to 2.5 $cm^3/g$). More preferably, $P_1$ may be in the range of 0.75 to 2.5, or in the range of 0.8 to 2.5, or in the range of 0.85 to 2.5, or in the range of 0.9 to 2.5, or in the range of 0.95 to 2.5, or in the range of 1 to 2.5, or in the range of 0.8 to 2.2, or in the range of 0.85 to 2.2, or in the range of 0.9 to 2.2, or in the range of 0.95 to 2.2, or in the range of 1 to 2.2, or in the range of 1.05 to 2.2, or in the range of 1.1 to 2.2, or in the range of 0.8 to 2, or in the range of 0.85 to 2, or in the range of 0.9 to 2, or in the range of 0.95 to 2, or in the range of 1 to 2, or in the range of 1.05 to 2, or in the range of 1.1 to 2, or in the range of 0.8 to 1.9, or in the range of 0.85 to 1.9, or in the range of 0.9 to 1.9, or in the range of 0.95 to 1.9, or in the range of 1 to 1.9, or in the range of 1.05 to 1.9, or in the range of 1.1 to 1.9, or in the range of 0.8 to 1.8, or in the range of 0.85 to 1.8, or in the range of 0.9 to 1.8, or in the range of 0.95 to 1.8, or in the range of 1 to 1.8, or in the range of 1.05 to 1.8, or in the range of 1.1 to 1.8, or in the range of 0.8 to 1.7, or in the range of 0.85 to 1.7, or in the range of 0.9 to 1.7, or in the range of 0.95 to 1.7, or in the range of 1 to 1.7, or in the range of 1.05 to 1.7, or in the range of 1.1 to 1.7, or in the range of 0.8 to 1.6, or in the range of 0.85 to 1.6, or in the range of 0.9 to 1.6, or in the range of 0.95 to 1.6, or in the range of 1 to 1.6, or in the range of 1.05 to 1.6, or in the range of 1.1 to 1.6.

The $PD_{50}$ pore diameter of porous carbon frameworks 1 is no more than 5 nm. The term "$PD_{50}$ pore diameter" as used herein refers to the volume-based median pore diameter, based on the total volume of micropores and mesopores (i.e. the pore diameter below which 50% of the total micropore and mesopore volume, represented by $P_1$, is found). Therefore, in accordance with porous carbon frameworks 1, at least 50% of the total volume of micropores and mesopores is in the form of pores having a diameter of less than 5 nm.

As used herein, the general term "$PD_n$ pore diameter" refers to the volume-based nth percentile pore diameter, based on the total volume of micropores and mesopores. For instance, the term "$D_{90}$ pore diameter" as used herein refers to the pore diameter below which 90% of the total micropore and mesopore volume, represented by $P_1$, is found).

For the avoidance of doubt, any macropore volume (pore diameter greater than 50 nm) is not taken into account for the purpose of determining $PD_n$ values.

In accordance with porous carbon frameworks 1, the $PD_{50}$ pore diameter of the porous carbon framework is preferably no more than 4 nm, or no more than 3 nm, or no more than 2.5 nm, or no more than 2 nm, or no more than 1.5 nm, or no more than 1.4 nm, or no more than 1.2 nm, or no more than 1 nm. Thus, it is particularly preferred that 50% or more of the total micropore and mesopore volume be in the form of micropores.

More preferably, at least 60% of the total micropore and mesopore volume of porous carbon framework 1 is in the form of pores having a diameter of no more than 5 nm. Accordingly, the $PD_{60}$ pore diameter of porous carbon framework 1 is preferably no more than 5 nm, or no more than 4 nm, or no more than 3 nm, or no more than 2.5 nm, or no more than 2 nm, or no more than 1.8 nm, or no more than 1.6 nm, or no more than 1.5 nm, or no more than 1.4 nm, or no more than 1.2 nm, or no more than 1 nm.

More preferably, at least 70% of the total micropore and mesopore volume of porous carbon framework 1 is in the form of pores having a diameter of no more than 5 nm. Accordingly, the $PD_{70}$ pore diameter of porous carbon framework 1 is preferably no more than 5 nm, or no more than 4 nm, or no more than 3 nm, or no more than 2.5 nm, or no more than 2 nm, or no more than 1.8 nm, or no more than 1.6 nm, or no more than 1.4 nm, or no more than 1.2 nm.

More preferably, at least 80% of the total micropore and mesopore volume of porous carbon framework 1 is in the form of pores having a diameter of no more than 5 nm. Accordingly, the $PD_{80}$ pore diameter of porous carbon framework 1 is preferably no more than 5 nm, or no more than 4 nm, or no more than 3 nm, or no more than 2.5 nm, or no more than 2 nm, or no more than 1.8 nm, or no more than 1.6 nm, or no more than 1.4 nm.

The volume of larger mesopores in porous carbon framework 1 is preferably limited such that the $PD_{90}$ pore diameter of porous carbon framework 1 is no more than 20 nm, or no more than 15 nm, or no more than 12 nm, or no more than 10 nm, or no more than 8 nm, or no more than 6 nm, or no more than 5 nm, or no more than 4 nm, or no more than 3 nm, or no more than 2.5 nm, or no more than 2 nm.

Preferably, the $PD_{95}$ pore diameter of porous carbon framework 1 is no more than 20 nm, or no more than 15 nm, or no more than 12 nm, or no more than 10 nm.

In accordance with the invention, porous carbon framework 1 may be one in which $PD_{50}$ is no more than 5 nm and $PD_{90}$ is no more than 20 nm, or one in which $PD_{50}$ is no more than 4 nm and $PD_{90}$ is no more than 15 nm, or one in which $PD_{50}$ is no more than 3 nm and $PD_{90}$ is no more than 12 nm, or one in which $PD_{50}$ is no more than 2.5 nm and $PD_{90}$ is no more than 10 nm, or one in which $PD_{50}$ is no more than 2 nm and $PD_{90}$ is no more than 8 nm, or one in which $PD_{50}$ is no more than 1.5 nm and $PD_{90}$ is no more than 6 nm, or one in which $PD_{50}$ is no more than 1.2 nm and $PD_{90}$ is no more than 5 nm, or one in which $PD_{50}$ is no more than 1 nm and $PD_{90}$ is no more than 4 nm.

A fraction of pores having diameters in the larger mesopore range may be advantageous to facilitate electrolyte access to the silicon. Therefore, pores having a diameter in the range of 10 to 50 nm (i.e. larger mesopores) may optionally constitute up to 1%, up to 2%, up to 5% or up to 10% of the total micropore and mesopore volume of porous carbon framework 1.

The pore size distribution of porous carbon framework 1 may be monomodal, bimodal or multimodal. A bimodal or multimodal pore size distribution may be preferred since close proximity between the pores up to 5 nm in diameter and pores of larger diameter provides the advantage of efficient ionic transport through the porous network to the silicon.

Optionally, porous carbon framework 1 has a bimodal or multimodal pore size distribution including at least one peak at less than 2 nm and at least one peak in the range of 5 to 50 nm, preferably with a local minimum in the pore size distribution in the range of 5 to 20 nm. More preferably, porous carbon framework 1 has a bimodal or multimodal pore size distribution including at least one peak at less than 2 nm and at least one peak in the range of 10 to 40 nm, preferably with a local minimum in the pore size distribution in the range of 5 to 15 nm.

Suitably, a bimodal or multimodal pore size distribution includes a peak pore size in the micropore range and a peak pore size in the mesopore size range which differ from one another by a factor of 5 to 20, more preferably by a factor of about 10. For instance, porous carbon framework 1 may have a bimodal pore size distribution including a peak at a pore size of 2 nm and a peak at a pore size of 20 nm.

$P^2$ is preferably small as compared to $P^1$. $P^2$ preferably has a value of no more than $0.2 \times P^1$, or no more than $0.1 \times P^1$, or no more than $0.05 \times P^1$, or no more than $0.02 \times P^1$, or no more than $0.01 \times P^1$, or no more than $0.005 \times P^1$. $P^2$ preferably has a value of no more than 0.3, or no more than 0.25, or no more than 0.20, or no more than 0.15, or no more than 0.1, or no more than 0.05. The open pore network optionally includes a hierarchical pore structure, i.e. a pore structure in which there is a degree of ordering of pore sizes, with smaller pores branching from larger pores.

Porous Carbon Frameworks 2

The pore volume of porous carbon frameworks 2 is distributed between micropores and mesopores such that the volume fraction of micropores $\varphi_a$ is in the range of 0.1 to 0.9, based on the total volume of micropores and mesopores.

Porous carbon frameworks 2 are also defined by a pore volume that is substantially skewed towards smaller pores, such that a minimum of 75% of the total micropore and mesopore volume is in the form of pores having a diameter of no more than 20 nm. The volume fraction of pores having a diameter of no more than 20 nm (based on the total volume of micropores and mesopores) is represented herein by the symbol $\varphi_{20}$, with the symbols $\varphi_{10}$ and $\varphi_5$ being used to define the corresponding volume fractions of pores having diameters of no more than 10 nm and no more than 5 nm, respectively.

Porous carbon frameworks 2 are characterized by a high pore volume in the form of micropores and/or mesopores. Preferably, the value of $P_1$ is at least 0.65, more preferably at least 0.7, more preferably at least 0.75, more preferably at least 0.8, more preferably at least 0.85, more preferably at least 0.9, more preferably at least 0.95, and most preferably at least 1. Optionally, the total volume of micropores and mesopores may be greater than 1 cm$^3$/g, for instance, $P_1$ may be at least 1.05, or at least 1.1, or at least 1.15, or at least 1.2.

In general, the value of $P_1$ may be up to 2.2. However, more preferably, the value of $P^1$ may be no more than 2.2, more preferably no more than 1.8, more preferably no more than 1.6, more preferably no more than 1.5, more preferably no more than 1.4, more preferably no more than 1.3, more preferably no more than 1.2.

In accordance with the invention, the value of $P_1$ for the porous frameworks 2 may be, for instance, in the range of 0.6 to 2 (i.e. a total volume of micropores and mesopores of 0.6 to 2 cm$^3$/g). For instance, $P_1$ may be in the range of 0.6 to 1.8, or in the range of 0.65 to 1.8, or in the range of 0.7 to 1.8, or in the range of 0.75 to 1.8, or in the range of 0.8 to 1.8, or in the range of 0.85 to 1.8, or in the range of 0.9 to 1.8, or in the range of 0.65 to 1.7, or in the range of 0.7 to 1.7, or in the range of 0.75 to 1.7, or in the range of 0.8 to 1.7, or in the range of 0.85 to 1.7, or in the range of 0.9 to 1.7, or in the range of 0.95 to 1.7, or in the range of 0.7 to 1.6, or in the range of 0.75 to 1.6, or in the range of 0.8 to 1.6, or in the range of 0.85 to 1.6, or in the range of 0.9 to 1.6, or in the range of 0.95 to 1.6, or in the range of 1 to 1.6, or in the range of 0.75 to 1.5, or in the range of 0.8 to 1.5, or in the range of 0.85 to 1.5, or in the range of 0.9 to 1.5, or in the range of 0.95 to 1.5, or in the range of 1 to 1.5, or in the range of 0.8 to 1.4, or in the range of 0.85 to 1.4, or in the range of 0.9 to 1.4, or in the range of 0.95 to 1.4, or in the range of 1 to 1.4.

The volume fraction of micropores ($\varphi_a$) is preferably in the range from 0.15 to 0.85, more preferably in the range from 0.2 to 0.8. In some embodiments, $\varphi_a$ is preferably in the range of 0.45 to 0.85, more preferably in the range of 0.5 to 0.8, more preferably in the range of 0.55 to 0.8, more preferably in the range of 0.6 to 0.8, to take particular advantage of the high capacity retention of very fine nanostructures of electroactive material located within micropores. In other cases, $\varphi_a$ is preferably in the range of 0.2 to 0.5, more preferably in the range of 0.3 to 0.5, to take particular advantage of the opportunity for high loadings of electroactive material.

As discussed above, the pore volume is substantially skewed towards smaller pores, such that a minimum of 75% of the total micropore and mesopore volume of porous carbon framework 2 is in the form of pores having a diameter of no more than 20 nm. More preferably, $\varphi_{20}$ is at least 0.8, more preferably at least 0.85, more preferably at least 0.9.

Preferably, $\varphi_{10}$ is at least 0.75, more preferably at least 0.8, more preferably at least 0.85, based on the total volume of micropores and mesopores. More preferably, $\varphi_5$ is at least 0.7, more preferably at least 0.75, more preferably at least 0.8, more preferably at least 0.85, based on the total volume of micropores and mesopores. Thus, at least 75% of the total micropore and mesopore volume of the porous carbon frameworks 2 is preferably in the form of pores having a diameter of no more than 10 nm, and more preferably no more than 5 nm.

A fraction of pores having diameters in the larger mesopore range may be advantageous to facilitate electrolyte access to the silicon domains. Therefore, pores having a diameter in the range of 10 to 50 nm (i.e. larger mesopores) may optionally constitute up to 1%, up to 2%, up to 5%, or up to 10% of the total micropore and mesopore volume of the porous carbon framework 2.

The pore size distribution of porous carbon framework 2 may be monomodal, bimodal or multimodal. A bimodal or multimodal pore size distribution may be preferred since close proximity between the smallest pores and pores of larger diameter provides the advantage of efficient ionic transport through the porous network to the silicon.

Suitably, a bimodal or multimodal pore size distribution includes a peak pore size in the micropore range and a peak pore size in the mesopore size range which differ from one another by a factor of from 5 to 20, more preferably by a factor of about 10. For instance, porous carbon framework 2 may have a bimodal pore size distribution including a peak at a pore size of 1.5 nm and a peak at a pore size of 15 nm.

$P_2$ is preferably small as compared to $P_1$. $P_2$ preferably has a value of no more than $0.2 \times P_1$, or no more than $0.1 \times P_1$, or no more than $0.05 \times P_1$, or no more than $0.02 \times P_1$, or no more than $0.01 \times P_1$, or no more than $0.005 \times P_1$. $P_2$ preferably has a value of no more than 0.3, or no more than 0.25, or no more than 0.20, or no more than 0.15, or no more than 0.1, or no more than 0.05. The open pore network optionally includes a hierarchical pore structure, i.e. a pore structure in which there is a degree of ordering of pore sizes, with smaller pores branching from larger pores.

Porous Carbon Frameworks 3

Porous carbon frameworks 3 are characterized by a high pore volume in the form of micropores and/or mesopores. More preferably, the value of $P_1$ is at least 0.75, or at least 0.8, or at least 0.85, or at least 0.9, or at least 0.95, or at least 1, or at least 1.05, or at least 1.1, or at least 1.15, or at least 1.2. In general, the value of $P_1$ may be up to 2.5. However, more preferably, the value of $P^1$ may be up to 2.4, or up to 2.2, or up to 2, or up to 1.8, or up to 1.6, or up to 1.5.

In accordance with porous carbon frameworks 3, the value of $P_1$ may be, for instance, in the range of 0.7 to 2.5 (i.e. a total volume of micropores and mesopores of 0.7 to 2.5 cm$^3$/g). More preferably, $P_1$ may be in the range of 0.75 to 2.5, or in the range of 0.8 to 2.5, or in the range of 0.85 to 2.5, or in the range of 0.9 to 2.5, or in the range of 0.95 to 2.5, or in the range of 1 to 2.5, or in the range of 0.8 to 2.2, or in the range of 0.85 to 2.2, or in the range of 0.9 to 2.2, or in the range of 0.95 to 2.2, or in the range of 1 to 2.2, or in the range of 1.05 to 2.2, or in the range of 1.1 to 2.2, or in the range of 0.8 to 2, or in the range of 0.85 to 2, or in the range of 0.9 to 2, or in the range of 0.95 to 2, or in the range of 1 to 2, or in the range of 1.05 to 2, or in the range of 1.1 to 2, or in the range of 0.8 to 1.9, or in the range of 0.85 to 1.9, or in the range of 0.9 to 1.9, or in the range of 0.95 to 1.9, or in the range of 1 to 1.9, or in the range of 1.05 to 1.9, or in the range of 1.1 to 1.9, or in the range of 0.8 to 1.8, or in the range of 0.85 to 1.8, or in the range of 0.9 to 1.8, or in the range of 0.95 to 1.8, or in the range of 1 to 1.8, or in the range of 1.05 to 1.8, or in the range of 1.1 to 1.8, or in the range of 0.8 to 1.7, or in the range of 0.85 to 1.7, or in the range of 0.9 to 1.7, or in the range of 0.95 to 1.7, or in the range of 1 to 1.7, or in the range of 1.05 to 1.7, or in the range of 1.1 to 1.7, or in the range of 0.8 to 1.6, or in the range of 0.85 to 1.6, or in the range of 0.9 to 1.6, or in the range of 0.95 to 1.6, or in the range of 1 to 1.6, or in the range of 1.05 to 1.6, or in the range of 1.1 to 1.6.

The $PD_{50}$ pore diameter of porous carbon framework 3 is no more than 2 nm, preferably no more than 1.8 nm, or no more than 1.6 nm, or no more than 1.4 nm, or no more than 1.2 nm, or no more than 1 nm.

More preferably, at least 60% of the total micropore and mesopore volume of porous carbon framework 3 is in the form of pores having a diameter of no more than 3 nm. Accordingly, the $PD_{60}$ pore diameter of porous carbon framework 3 is preferably no more than 3 nm, or no more than 2.5 nm, or no more than 2 nm, or no more than 1.8 nm, or no more than 1.6 nm, or no more than 1.4 nm, or no more than 1.2 nm.

More preferably, at least 70% of the total micropore and mesopore volume of porous carbon framework 3 is in the form of pores having a diameter of no more than 3.5 nm. Accordingly, the $PD_{70}$ pore diameter of porous carbon framework 3 is preferably no more than 3.5 nm, or no more than 3 nm, or no more than 2.5 nm, or no more than 2.2 nm, or no more than 2 nm or no more than 2.5 nm, or no more than 2 nm, or no more than 1.8 nm, or no more than 1.6 nm, or no more than 1.4 nm.

More preferably, at least 80% of the total micropore and mesopore volume of porous carbon framework 3 is in the form of pores having a diameter of no more than 5 nm. Accordingly, the $PD_{80}$ pore diameter of porous carbon framework 3 is preferably no more than 5 nm, or no more than 4.5 nm, or no more than 4 nm, or no more than 3.5 nm, or no more than 3 nm, or no more than 2.5 nm, or no more than 2.2 nm, or no more than 2 nm, or no more than 1.8 nm, or no more than 1.6 nm.

The volume of larger mesopores in porous carbon framework 3 is preferably limited such that the $PD_{90}$ pore diameter of porous carbon framework 3 is no more than 10 nm, or no more than 8 nm, or no more than 6 nm, or no more than 5 nm, or no more than 4 nm, or no more than 3 nm, or no more than 2.5 nm, or no more than 2 nm.

Preferably, the $PD_{95}$ pore diameter of porous carbon framework 3 is no more than 15 nm, or no more than 12 nm, or no more than 10 nm.

In accordance with porous carbon frameworks 3, the porous carbon framework may be one in which $PD_{50}$ is no more than 2 nm and $PD_{90}$ is no more than 10 nm, or one in which $PD_{50}$ is no more than 1.8 nm and $PD_{90}$ is no more than 8 nm, or one in which $PD_{50}$ is no more than 1.6 nm and $PD_{90}$ is no more than 6 nm, or one in which $PD_{50}$ is no more than 1.2 nm and $PD_{90}$ is no more than 5 nm, or one in which $PD_{50}$ is no more than 1 nm and $PD_{90}$ is no more than 4 nm, or one in which $PD_{50}$ is no more than 1 nm and $PD_{90}$ is no more than 3 nm, or one in which $PD_{50}$ is no more than 1 nm and $PD_{90}$ is no more than 2.5 nm, or one in which $PD_{50}$ is no more than 1 nm and $PD_{90}$ is no more than 2 nm.

A fraction of pores having diameters in the larger mesopore range may be advantageous to facilitate electrolyte access to the electroactive material. Therefore, pores having a diameter in the range of 5 to 50 nm (i.e. larger mesopores) may optionally constitute up to 1%, up to 2%, up to 5%, or up to 10% of the total micropore and mesopore volume of porous carbon frameworks 3.

The pore size distribution of the porous carbon framework may be monomodal, bimodal or multimodal. A bimodal or multimodal pore size distribution may be preferred since close proximity between the pores up to 5 nm in diameter and pores of larger diameter provides the advantage of efficient ionic transport through the porous network to the electroactive material.

Optionally, porous carbon framework 3 has a bimodal or multimodal pore size distribution including at least one peak at less than 2 nm and at least one peak in the range of 2.5 to 20 nm, preferably with a local minimum in the pore size distribution in the range of 2 to 50 nm. More preferably, porous carbon framework 3 has a bimodal or multimodal pore size distribution including at least one peak at less than 2 nm and at least one peak in the range of 2.5 to 15 nm, preferably with a local minimum in the pore size distribution in the range of 2 to 5 nm.

Suitably, a bimodal or multimodal pore size distribution includes a peak pore size in the micropore range and a peak pore size in the mesopore size range which differ from one another by a factor of from 5 to 20, more preferably by a factor of about 10. For instance, porous carbon framework 3 may have a bimodal pore size distribution including a peak at a pore size of 1.2 nm and a peak at a pore size of 12 nm.

$P_2$ is preferably small as compared to $P_1$. $P_2$ preferably has a value of no more than $0.2 \times P_1$, or no more than $0.1 \times P_1$, or no more than $0.05 \times P_1$, or no more than $0.02 \times P_1$, or no more than $0.01 \times P_1$, or no more than $0.005 \times P_1$. $P_2$ preferably has a value of no more than 0.3, or no more than 0.25, or no more than 0.20, or no more than 0.15, or no more than 0.1, or no more than 0.05. The open pore network optionally includes a hierarchical pore structure, i.e. a pore structure in which there is a degree of ordering of pore sizes, with smaller pores branching from larger pores.

CVI/FBR

A lab-scale FBR may be used for contacting the porous carbon frameworks with a gas mixture containing a gaseous precursor of an electroactive material (e.g. silane) to deposit the electroactive material via CVI in the micropores and/or mesopores of the frameworks. Nitrogen gas may be used as the inert fluidizing gas but other inert gases such as argon, hydrogen, or helium can also be used. It will be understood that the porous carbon frameworks are fluidized in the FBR in the process of the invention.

The process of the invention uses CVI of a gaseous precursor of an electroactive material into the pore structure of the porous carbon framework. Preferably, the gaseous precursor is a silicon-bearing gas.

Suitable silicon-containing precursors include silane ($SiH_4$), disilane ($Si_2H_6$), trisilane ($Si_3H_8$), tetrasilane ($Si_4H_{10}$), or chlorosilanes such as trichlorosilane ($HSiCl_3$) or methylchlorosilanes such as methyltrichlorosilane ($CH_3SiCl_3$) or dimethyldichlorosilane (($CH_3)_2SiCl_2$). Preferably the silicon-containing precursor is silane.

The CVI process may also utilise a gaseous precursor of a dopant material to deposit a doped electroactive material into the micropores and/or mesopores of the porous carbon frameworks. When the dopant is boron suitable precursors include borane ($BH_3$), triisopropyl borate ($[(CH_3)_2CHO]_3B$), triphenylborane (($C_6H_5)_3B$), and tris(pentafluorophenyl)borane ($(C_6F_5)_3B$, preferably borane. When the dopant is phosphorous, a suitable precursor is phosphine ($PH_3$).

The precursors may be used either in pure form or more usually as a diluted mixture with an inert carrier gas, such as nitrogen or argon. For instance, the precursor may be used in an amount in the range from 0.5 to 20 vol %, or 1 to 10 vol %, or 1 to 5 vol % based on the total volume of the precursor and the inert carrier gas. The CVI process is suitably carried out at low partial pressure of gaseous precursor with total pressure at or close to 101.3 kPa (i.e. at atmospheric pressure, 1 atm), the remaining partial pressure made up to atmospheric pressure using an inert padding gas such as hydrogen, nitrogen or argon.

The temperature of the CVI process is suitably chosen to pyrolyze the precursor to the electroactive material. The CVI process is suitably performed at temperature in the range of 200 to 1250° C., or 400 to 700° C., or 400 to 600° C., or 400 to 550° C., or 450 to 550° C., or 450 to 500° C. Preferably the CVI process is performed at a temperature in the range of 400 to 500° C., preferably 450 to 500° C. The CVI process is preferably carried out at or above minimum fluidization velocity (Umf) of the particulate material. Preferably, the superficial velocity is above the minimum fluidization velocity (Umf) of the particulate material. The minimum fluidization velocity (Umf) is typically a measured quantity and its value varies depending on the particle size, particle density, and gas viscosity. The minimum fluidization velocity defines the flow rate of the gas that has to be supplied to the reactor vessel to achieve the velocity that lifts the particles to a "fluid-like" state. Flow rate of the CVI process is suitably chosen to provide a good solid-solid and solid-gas mixing and with minimum particle carry-over from the reactor. The CVI process is suitably performed in the range 1 to 20 times the minimum fluidization velocity (Umf).

Without wishing to be bound by theory, it is believed that the infiltration of the electroactive material is under kinetic control when the porous carbon framework particle size is controlled in the manner discussed above. It is believed that the kinetic control of infiltration will result in a composite particle with a uniform distribution of electroactive material throughout. This may, after a certain amount of the electroactive material is deposited, lead to occlusion of pores throughout the volume of the framework. Controlling the particle size of the porous carbon frameworks has the advantage of allowing a high infiltration efficiency at the temperature and concentration range used in the CVI process; whilst also rendering the frameworks amenable to fluidization in the classical sense (such as the Geldert A group).

Comminution

The process of the invention includes a step of comminuting the intermediate particles to provide said composite particles. The comminuting step is such that the particle size of the composite particles is lower than the particle size of the particulate porous carbon frameworks. A benefit of the invention is that the comminuting step allows for the use of CVI in an FBR, which is a process suitable for large-scale commercial use, while providing a final product with a low particle size suitable for use in metal-ion batteries.

Some agglomeration of the porous carbon frameworks may occur during the CVI process in the FBR. Accordingly, the particle size of the intermediate particles may be higher than the particle size of the porous carbon frameworks.

The comminuting step can be done by different comminuting techniques, such as wet milling, ball milling, jet milling, high-shear stirring, ultrasound etc. And as such, the comminuting device can be any number of devices, such as a wet mill, a ball mill, a jet mill, a high-shear mixer, an ultrasonicator. Preferably, the comminuting is performed in a dry mill due to the reactivity of the intermediate particles immediately after infiltration has finished, since the electroactive material deposited by the CVI process may be reactive. For example, silicon deposited from silane contains a significant amount of Si—H bonds. These bonds are reactive towards organic molecules and water. Accordingly, the presence of oxygen or an organic solvent may result in an exothermic reaction, potentially leading to degradation of the composite material below the quality required for commercial metal-ion battery material.

Among the dry mills, jet mills are preferred because of capability to grind to lower sizes. Jet mills use a high speed jet of compressed air or inert gas to impact particles with each other. Jet mills can be used with starting material with a size up to about 1 mm and are known to readily achieve sizes of the order of 1 μm with relatively little energy input.

There are different types of jet mills, e.g. rotational types (cyclic motion) and fluidized opposed-jet types. In the rotational type, particles are accelerated by using tangential gas force from the walls. The fluidized opposing-jet works by multiples of jet separated at equal angles from each other and works on colliding particles on collision trajectory towards each other. Fluidized opposing-jet type mills are more suitable when a higher capacity is desired. The grinding action in both types of jet mill is achieved by collision of particles with each other rather than with a hard target. This specific mode of action results in a comminuted product with narrow particle size distribution which is beneficial for incorporation into a metal-ion battery electrode. Additionally, the comminuted product has high purity when an inert grinding gas of controlled composition (limited oxygen and water content) is used.

Either a rotational jet mill (e.g. a spiral jet mill) or fluidized opposed jet-mill design can be used with a typical diameter of 0.04 m up to several meters, with grinding gas pressure suitably between 50 and 1000 kPa, and a maximum starting particle size of 1 mm. The grinding gas may be either an inert gas such as nitrogen or argon, or a mixture of these with a low partial pressure of air, water or oxygen.

The comminuted particles may optionally be classified according to size, for instance by centrifugation or by sieving. Alternatively, the jet mill device may include an integral classification device, such as a classifier wheel, which allows fine particles to leave the jet milling zone of the apparatus, but which rejects coarse particles such that these return directly to the jet milling zone.

The intermediate particles may be passivated before the comminution step. That is, the particle surfaces may be treated to reduce their chemical reactivity, preferably to minimize or prevent any further oxidation of the particle surfaces in subsequent process steps or handling. For example, the intermediate particles may be passivated in a low oxygen concentration environment such as where the oxygen concentration is less than 10 vol % oxygen. An inert gas such as nitrogen may be used to passivate the intermediate particles. A low-oxygen concentration gas mixture may also be used. Passivating the intermediate particles has the advantage that unwanted further reaction of the intermediate particle is suppressed. For example, passivating the intermediate particles may remove the reactive Si—H bonds. This helps maintain the structure of the electroactive material deposited in the pores of porous carbon frameworks derived from the CVI process, which is beneficial when the composite particles are used in metal-ion batteries. The comminution step may also be performed in a low oxygen concentration environment, such as in an inert gas or a low-oxygen concentration gas mixture. Conveniently, the commination step can be performed in the same atmosphere as the optional passivating step.

The intermediate particles may be cooled before the commination step, optionally in combination with the passivating step. The cooling may be to a temperature of below 100° C., or below 50° C., or to ambient temperature. Cooling the intermediate particles has the advantage of facilitating the transfer of the intermediate particles to a comminuting device.

The process of the invention may be a continuous process or a batch process. In a continuous process, the passivation and cooling steps can be performed in a separate vessel to the FBR. The separate vessel to the FBR may be a comminuting device.

Composite Particle Product

It is a benefit of the invention that the properties of the composite particle product may be controlled by choosing the properties of the porous carbon framework starting material. This is achieved because the inventors have found that comminution may occur without a significant level of damage due to the relative μm-length scale of fracture compared to the nm-length scale of the functional unit of the composite particles. In other words, the comminution step provides the desired particle size for the composite particle product, while maintaining the desirable nanostructure obtained from using FBR-CVI to deposit the electroactive material into the porous carbon framework comprising micropores and/or mesopores. For instance, both the intermediate particles and the composite particles may comprise a plurality of nanoscale domains of the electroactive material located within the micropores and/or mesopores of the porous carbon frameworks. As used herein, the term "nanoscale domain" refers to a nanoscale body of electroactive material with maximum dimensions that are defined by the pore diameters of the pores in which the electroactive material is located.

The composite particles in general terms are particles in which nanoscale domains of the electroactive material occupy at least a portion of the pore volume of a porous carbon framework in which the pore volume includes micropores and/or mesopores. It has been found that this particle architecture provides an electroactive material with very high gravimetric and volumetric capacity on lithiation and high reversible capacity retention over multiple charge-discharge cycles.

Without being bound by theory, it is believed that locating nanoscale electroactive domains within micropores and/or mesopores firstly provides fine electroactive structures which are able to lithiate and delithiate without excessive structural stress. It is believed that these very fine electroactive domains have a lower resistance to elastic deformation and higher fracture resistance than larger electroactive structures. By ensuring that a relatively high proportion of the pore volume is occupied by the electroactive material, the composite particles may have a high capacity. Furthermore, by locating nanoscale electroactive domains within micropores and/or mesopores only a small area of electroactive surface is accessible to electrolyte and SEI formation is therefore limited.

In some cases, the composite particles produced by the invention may include pores in which fully enclosed void space is capped by the electroactive material, such that electrolyte access into the void space is prevented.

The particle size of the composite particles may be targeted by controlling the comminution step, and optionally the step of classifying the particles according to size, to provide a desired particle size distribution for the end-use.

As a result of the comminution in step (d), the composite particles have a $D_{50}$ particle size that is less than the $D_{50}$ particle size of the porous carbon framework starting material. In particular, the composite particles preferably have a $D_{50}$ particle diameter of no more than 40 µm, or no more than 30 µm, or no more than 25 µm, or no more than 20 µm. More preferably the composite particles have a $D_{50}$ particle size of no more than 15 µm, or no more than 12 µm, or no more than 10 µm, or no more than 9 µm, or no more than 8 µm, or no more than 6.5 µm, or no more than 6 µm, or no more than 5.5 µm, or no more than 5 µm, or no more than 4.5 µm, or no more than 4 µm, or no more than 3.5 µm. The composite particles may have a $D_{50}$ particle diameter of at least 1 µm, or at least 2 µm, or at least 3 µm, or at least 4 µm, or at least 5 µm. For instance, the composite particles may have a $D_{50}$ particle diameter in the range of 0.5 to 40 µm, or 0.5 to 20 µm, or 0.5 to 15 µm, or 0.5 to 12 µm, or 0.5 to 10 µm, or 0.5 to 9 µm, or 0.5 to 8 µm, or 0.5 to 7 µm. Composite particles within these size ranges and having porosity and a pore diameter distribution as set out herein are ideally suited for use in anodes for metal-ion batteries due to their dispersibility in slurries, their structural robustness, and their capacity retention over repeated charge-discharge cycles.

The composite particles may have a $D_{10}$ particle diameter of at least 0.2 µm, or at least 0.5 µm, or at least 0.8 µm, or at least 1 µm, or at least 1.5 µm, or at least 2 µm. By maintaining the $D_{10}$ particle diameter at 0.2 µm or more, the potential for undesirable agglomeration of sub-micron sized particles is reduced, resulting in improved dispersibility of the particulate material and improved capacity retention.

The composite particles may have a $D_{90}$ particle diameter of no more than 80 µm, or no more than 60 µm, or no more than 40 µm, or no more than 30 µm, or no more than 25 µm, or no more than 20 µm, or no more than 15 µm, or no more than 12 µm, or no more than 10 µm, or no more than 9.5 µm, or no more than 9 µm, or no more than 8.5 µm, or no more than 8 µm, or no more than 7.5 µm, or no more than 7 µm, or no more than 6.5 µm, or no more than 6 µm, or no more than 5.5 µm, or no more than 5 µm, or no more than 4.5 µm, or no more than 4 µm. The presence of very large particles results in non-uniform forming packing of the particles in electrode active layers, thus disrupting the formation of dense electrode layers, particularly electrode layers having a thickness in the conventional range of 20 to 50 µm.

The composite particles may have a particle size distribution span of 5 or less, or 4 or less, or 3 or less, or 2 or less, or 1.5 or less. By maintaining a narrow size distribution span, efficient packing of the particles into dense electrode layers is more readily achievable.

The composite particles may be spheroidal in shape. Spheroidal particles as defined herein may include both spherical and ellipsoidal particles and the shape of the composite particles of the invention may suitably be defined by reference to the sphericity and the aspect ratio of the particles of the invention. Spheroidal particles are found to be particularly well-suited to dispersion in slurries without the formation of agglomerates. In addition, the use of porous spheroidal particles is surprisingly found to provide a further improvement in strength when compared to porous particles and porous particle fragments of irregular morphology.

The sphericity of an object is conventionally defined as the ratio of the surface area of a sphere to the surface area of the object, wherein the object and the sphere have identical volume. However, in practice it is difficult to measure the surface area and volume of individual particles at the micron scale. However, it is possible to obtain highly accurate two-dimensional projections of micron scale particles by scanning electron microscopy (SEM) and by dynamic image analysis, in which a digital camera is used to record the shadow projected by a particle. The term "sphericity" as used herein shall be understood as the ratio of the area of the particle projection to the area of a circle, wherein the particle projection and circle have identical circumference. Thus, for an individual particle, the sphericity S may be defined as:

$$S = \frac{4 \cdot \pi \cdot A_m}{(C_m)^2}$$

wherein $A_m$ is the measured area of the particle projection and $C_m$ is the measured circumference of the particle projection. The average sphericity $S_{av}$ of a population of particles as used herein is defined as:

$$S_{av} = \frac{1}{n}\sum_{i=1}^{n}\left[\frac{4 \cdot \pi \cdot A_m}{(C_m)^2}\right]$$

wherein n represents the number of particles in the population.

As used herein, the term "spheroidal" as applied to the composite particles shall be understood to refer to a material having an average sphericity of at least 0.70. Preferably, the composite particles have an average sphericity of at least 0.85, more preferably at least 0.90, more preferably at least 0.92, more preferably at least 0.93, more preferably at least 0.94, more preferably at least 0.95. Optionally, the composite particles may have an average sphericity of at least 0.96, or at least 0.97, or at least 0.98, or at least 0.99.

It will be understood that the circumference and area of a two-dimensional particle projection will depend on the orientation of the particle in the case of any particle which is not perfectly spheroidal. However, the effect of particle orientation may be offset by reporting sphericity and aspect ratios as average values obtained from a plurality of particles having random orientation. A number of SEM and dynamic image analysis instruments are commercially available, allowing the sphericity and aspect ratio of a particulate material to be determined rapidly and reliably. Unless stated otherwise, sphericity values as specified or reported herein are as measured by a CamSizer XT particle analyzer from Retsch Technology GmbH. The CamSizer XT is a dynamic image analysis instrument which is capable of obtaining highly accurate distributions of the size and shape for particulate materials in sample volumes of from 100 mg to 100 g, allowing properties such as average sphericity and aspect ratios to be calculated directly by the instrument.

Preferably, the composite particles of the invention have a BET surface area of no more than 150 $m^2/g$, or no more than 100 $m^2/g$, or no more than 80 $m^2/g$, or no more than 60 $m^2/g$, or no more than 40 $m^2/g$, or no more than 30 $m^2/g$, or no more than 25 $m^2/g$, or no more than 20 $m^2/g$, or no more than 15 $m^2/g$, or no more than 10 $m^2/g$. In general, a low BET surface area is preferred in order to minimize the formation of solid electrolyte interphase (SEI) layers at the surface of the composite particles during the first charge-discharge cycle of an anode comprising the particulate material of the invention. However, a BET surface area which is excessively low results in unacceptably low charging rate and capacity due to the inaccessibility of the bulk of the electroactive material to metal ions in the surrounding electrolyte. For instance, the BET surface area is preferably at least 0.1 $m^2/g$, or at least 1 $m^2/g$, or at least 2 $m^2/g$, or at least 5 $m^2/g$. For instance, the BET surface area may be in the range of 1 $m^2/g$ to 25 $m^2/g$, more preferably in the range of 2 to 15 $m^2/g$.

Preferably the electroactive mass in the composite particles is located substantially or entirely within the pores of the porous carbon framework in the form of the nanoscale electroactive domains that are described above. For example, it is preferred that at least 90 wt %, more preferably at least 95 wt %, more preferably at least 98 wt %, more preferably at least 99 wt % of the electroactive mass in the composite particles is located within the internal pore volume of the porous carbon framework such that there is no or very little electroactive material located on the external surfaces of the composite particles.

Preferably, the volume of micropores and mesopores in the composite particles (i.e. in the presence of the electroactive material), as measured by nitrogen gas adsorption, is no more than $0.15 \times P_1$, or no more than $0.10 \times P_1$, or no more than $0.05 \times P_1$, or no more than $0.02 \times P_1$.

The weight ratio of the electroactive material such as silicon to the porous carbon framework in the composite particles can be determined by elemental analysis. Elemental analysis is used to determine the weight percentages of both the electroactive material and carbon in the composite particles. Optionally, the amounts of hydrogen, nitrogen and oxygen may also be determined by elemental analysis. Preferably, elemental analysis is also used to determine the weight percentage of carbon (and optionally hydrogen, nitrogen and oxygen) in the porous carbon framework alone. Determining the weight percentage of carbon in the in the porous carbon framework alone takes account of the possibility that the porous carbon framework contains a minor amount of heteroatoms within its molecular framework. Both measurements taken together allow the weight percentage of silicon relative to the entire porous carbon framework to be determined reliably.

The silicon content is determined by ICP-OES (Inductively coupled plasma-optical emission spectrometry). A number of ICP-OES instruments are commercially available, such as the iCAP® 7000 series of ICP-OES analyzers available from ThermoFisher Scientific. The carbon content of the composite particles and of the porous carbon framework alone (as well as the hydrogen, nitrogen and oxygen content if required) are determined by IR absorption-based elemental analysis. Suitable instruments for determining carbon, hydrogen, nitrogen and oxygen content include the TruSpec® Micro elemental analyser, the LECO model CS844 (carbon) and the LECO model ONH836 (hydrogen, nitrogen and oxygen), all available from Leco Corporation.

In certain aspects, the composite particles described herein are formed chiefly of silicon, carbon and oxygen (e.g., individually in the amounts as described above). In certain embodiments, the sum of the amount of silicon and carbon (measured as described above) of the composite particles is at least 80%, e.g., at least 85 wt %, at least 90 wt %, or at least 95 wt %. For example, in various embodiments, the sum of the amount of silicon and carbon is in the range of 80-98 wt %, or 85-98 wt %, or 90-98 wt %, or 95-98 wt %. In certain embodiments, the sum of the amount of silicon, carbon and oxygen (measured as described above) is at least 90 wt %, e.g., at least 95 wt %, at least 97 wt %, or at least 98 wt %. For example in various embodiments, the sum of the amount of silicon, carbon and oxygen is in the range of 90-105 wt %, or 90-100 wt %, or 90-99 wt %, or 95-105 wt %, or 95-100 wt %, or 97-105 wt %, or 97-100 wt %, or 98-105 wt %, or 98-100 wt %. The person of ordinary skill in the art will appreciate that the different measurement techniques used may result in a sum of the as-measured silicon, carbon, and oxygen amounts that are slightly above 100%. And as the person of ordinary skill in the art will appreciate, many of the elemental analysis techniques described herein are destructive, such that different test samples from a single composition must be tested to provide, e.g., a measurement of silicon weight percent and a measurement of carbon weight percent.

Suitably, when the electroactive material is silicon, the composite particles comprise 30 to 80 wt % silicon, preferably 45 to 65 wt % silicon.

The composite particles preferably have a low total oxygen content. Oxygen may be present in the composite particles for instance as part of the porous carbon framework or as an oxide layer on any exposed silicon surfaces. Preferably, the total oxygen content of the composite particles is less than 15 wt %, more preferably less than 10 wt %, more preferably less than 5 wt %, for example less than 2 wt %, or less than 1 wt %, or less than 0.5 wt %.

The amount of electroactive material in the porous carbon frameworks of the composite particles can be correlated to the available pore volume. For instance, when the electroactive material is silicon, the weight ratio of silicon to the porous carbon framework in the composite particles is preferably in the range of $[0.5 \times P_1$ to $2.2 \times P_1]:1$. This relationship takes into account the density of silicon and the pore volume of the porous carbon framework to define a weight ratio of silicon at which the pore volume is around 20 to 95 vol % occupied by silicon.

The weight ratio of silicon to the porous carbon framework in the composite particles may optionally be in the range of $[0.5 \times P_1$ to $1.3 \times P_1]:1$. This defines a weight ratio of silicon at which the pore volume is around 20 to 55 vol % occupied by silicon. Composite particles of this type are particularly suitable for use in electrodes comprising a high loading of the composite particles relative to any other electroactive materials that may be present.

The weight ratio of silicon to the porous carbon framework in the composite particles may also be in the range of $[1 \times P_1$ to $2.2 \times P_1]:1$. This defines a weight ratio of silicon at which the pore volume is around 43 to 95 vol % occupied by silicon. Composite particles of this type are particularly suitable for use in hybrid electrodes in which a relatively low loading of the composite particles is used to supplement other electroactive materials, e.g. such as graphite.

The composite particles typically have a specific charge capacity on first lithiation of 1200 to 2340 mAh/g. Preferably the composite particles have a specific charge capacity on first lithiation of at least 1400 mAh/g.

As discussed above, certain classes of composite particle product can be targeted by using certain classes of porous carbon frameworks. It will be understood that the pore structure of the porous carbon frameworks, such as the micropores and/or mesopores, will be retained in the composite particle product. Certain non-limiting classes of composite particle product are discussed below. It will be understood that the features of the classes of composite particles discussed below are to be considered in combination with the features of the composite particles discussed above, such as the particle size.

Composite Particles 1

Composite particles 1 obtainable by the process of the invention comprise:

(a) a porous carbon framework comprising micropores and/or mesopores,
wherein the micropores and/or mesopores have a total pore volume as measured by gas adsorption of $P_1$ cm³/g, wherein $P_1$ has a value of at least 0.7, and
wherein the $PD_{50}$ pore diameter as measured by gas adsorption is no more than 5 nm; and
(b) a plurality of elemental nanoscale silicon domains located within the micropores and/or mesopores of the porous carbon framework;
wherein the weight ratio of silicon to the porous carbon framework in the composite particles is in the range of $[0.5 \times P_1$ to $1.3 \times P_1]:1$.

Composite particles 1 may be produced using porous carbon frameworks 1 as the starting material. Therefore, the pore structure of the porous carbon frameworks 1 may be present in composite particles 1.

Composite particles 1 relates to a particulate material in which the porous carbon framework has relatively high total volume of micropores and mesopores, with pores having a diameter of no more than 5 nm constituting at least 50% of the total pore volume. This pore structure may be derived from porous carbon frameworks 1. Elemental silicon is located in the micropores and/or mesopores in the form of a plurality of nanoscale silicon domains. The weight ratio of silicon to the porous carbon framework is correlated to the total micropore/mesopore volume by the ratio $[0.5 \times P_1$ to $1.3 \times P^1]:1$. This corresponds to a silicon volume that is approximately 20 to 55% of the total micropore/mesopore volume.

Preferably, the weight ratio of silicon to the porous carbon framework is in the range of $[0.55 \times P_1$ to $1.1 \times P_1]:1$, or in the range of $[0.6 \times P_1$ to $1.1 \times P_1]:1$, or in the range of $[0.6 \times P_1$ to $1 \times P_1]:1$, or in the range of $[0.6 \times P_1$ to $0.95 \times P_1]:1$, or in the range of $[0.6 \times P_1$ to $0.9 \times P_1]:1$, or in the range of $[0.65 \times P_1$ to $0.9 \times P_1]:1$, or in the range of $[0.65 \times P_1$ to $0.85 \times P_1]:1$, or in the range of $[0.65 \times P_1$ to $0.8 \times P_1]:1$, or in the range of $[0.7 \times P_1$ to $0.8 \times P_1]:1$.

The amount of silicon in composite particles 1 is preferably selected such that no more than about 55% of the internal pore volume of the porous carbon framework is occupied by silicon (in the uncharged state). Preferably, the silicon occupies from about 25% to about 45% of the internal pore volume of the porous carbon framework, more preferably from about 25% to about 40% of the internal pore volume of the porous carbon framework. Within these preferred ranges, the pore volume of the porous carbon framework is effective to accommodate expansion of the silicon during charging and discharging, but avoids excess pore volume which does not contribute to the volumetric capacity of the particulate material. However, the amount of silicon is also not so high as to impede effective lithiation due to inadequate metal-ion diffusion rates or due to inadequate expansion volume resulting in mechanical resistance to lithiation.

In some cases, composite particles 1 may include pores in which fully enclosed void space is capped by the silicon, such that electrolyte access into the void space is prevented.

Preferably at least 90 wt %, more preferably at least 95 wt %, even more preferably at least 98 wt % of the silicon mass in composite particles 1 is located within the internal pore volume of the porous carbon framework such that there is no or very little silicon located on the external surface of the composite particles.

The composite particles 1 may have a $D_{50}$ particle diameter in the range of 0.5 to 50 µm. Optionally, the $D_{50}$ particle diameter may be at least 1 µm, or at least 2 µm, or at least 3 µm, or at least 4 µm, or at least 5 µm. Optionally the $D_{50}$ particle diameter may be no more than 40 µm, or no more than 30 µm, or no more than 25 µm, or no more than 20 µm, or no more than 15 µm.

For instance, the composite particles 1 may have a $D_{50}$ particle diameter in the range of 1 to 25 µm, or from 1 to 20 µm, or from 2 to 20 µm, or from 2 to 15 µm, or from 3 to 15 µm. Particles within these size ranges and having porosity and a pore diameter distribution as set out herein are ideally suited for use in anodes for metal-ion batteries, due to their dispersibility in slurries, their structural robustness, their capacity retention over repeated charge-discharge cycles, and their suitability for forming dense electrode layers of uniform thickness in the conventional range of 20 to 50 µm.

The $D_{10}$ particle diameter of composite particles 1 is preferably at least 0.2 µm, or at least 0.5 µm, or at least 0.8 µm, or at least 1 µm, or at least 1.5 µm, or at least 2 µm. By maintaining the $D_{10}$ particle diameter at 0.2 µm or more, the potential for undesirable agglomeration of sub-micron sized particles is reduced, resulting in improved dispersibility of the particulate material and improved capacity retention.

The $D_{90}$ particle diameter of composite particles 1 is preferably no more than 80 µm, or no more than 60 µm, or no more than 40 µm, or no more than 30 µm, or no more than 25 µm, or no more than 20 µm. The presence of very large particles results in non-uniform forming packing of the particles in electrode active layers, thus disrupting the formation of dense electrode layers, particularly electrode layers having a thickness in the range of 20 to 50 µm.

Therefore, it is preferred that the $D_{90}$ particle diameter is no more than 40 μm, and more preferably lower still.

Composite particles 1 preferably have a BET surface area of no more than 150 m²/g, or no more than 100 m²/g, or no more than 80 m²/g, or no more than 60 m²/g, or no more than 40 m²/g, or no more than 30 m²/g, or no more than 25 m²/g, or no more than 20 m²/g, or no more than 15 m²/g, or no more than 10 m²/g. The BET surface area is preferably at least 0.1 m²/g, or at least 1 m²/g, or at least 2 m²/g, or at least 5 m²/g. For instance, the BET surface area may be in the range of 1 to 25 m²/g, more preferably in the range of 2 to 15 m²/g.

Composite Particles 2

Composite particles 2 produced by the process of the invention comprise:
  (a) a porous carbon framework comprising micropores and mesopores, wherein
    (i) the micropores and mesopores have a total pore volume as measured by gas adsorption of $P_1$ cm³/g, wherein $P_1$ has a value of at least 0.6,
    (ii) the volume fraction of micropores ($\varphi_a$) is in the range from 0.1 to 0.9, based on the total volume of micropores and mesopores;
    (iii) the volume fraction of pores having a pore diameter no more than 20 nm ($\varphi_{20}$) is at least 0.75, based on the total volume of micropores and mesopores, and
    (iv) the porous carbon framework has a $D_{50}$ particle size of less than 20 μm;
  (b) a plurality of nanoscale elemental silicon domains located within the micropores and/or mesopores of the porous carbon framework;

wherein the weight ratio of silicon to the porous carbon framework in the composite particles is in the range of $[1 \times P_1$ to $2.2 \times P_1]:1$.

Composite particles 2 may be produced using porous carbon frameworks 2 as the starting material. Therefore, the pore structure of the porous carbon frameworks 2 may be present in composite particles 2.

Composite particles 2 are particularly suitable for use in "hybrid" electrodes comprising a combination of graphite and the composite particles.

Composite particles 2 relate to a particulate material in which the porous carbon framework comprises both micropores and mesopores with a minimum total volume of at least 0.6 cm³/g. The pore volume is distributed between micropores and mesopores such that the volume fraction of micropores is in the range of 0.1 to 0.9. The porous carbon framework is also defined by a pore volume that is substantially skewed towards smaller pores, such that a minimum of 75% of the total micropore and mesopore volume is in the form of pores having a diameter of no more than 20 nm. This pore structure may be derived from porous carbon frameworks 2.

The porous carbon framework in composite particles 2 is furthermore defined by a $D_{50}$ particle size of less than 20 μm.

The weight ratio of silicon to the porous carbon framework in the composite particles is in the range of $[1 \times P_1$ to $2.2 \times P_1]:1$. The weight ratio of silicon to the porous carbon framework is therefore proportional to the available pore volume in the porous carbon framework, such that a weight ratio of $[1 \times P_1]:1$ corresponds to around 43% v/v occupancy of the pores of the porous carbon framework by silicon, taking into account silicon density of around 2.3 g/cm³. The upper limit of the ratio at $[2.2 \times P_1]:1$ corresponds to around 95% v/v occupancy of the pores of the porous carbon framework by silicon.

Preferably, the weight ratio of silicon to the porous carbon framework is at least $1.1 \times P_1$, more preferably at least $1.15 \times P_1$, more preferably at least $1.2 \times P_1$, more preferably at least $1.25 \times P_1$, more preferably at least $1.3 \times P_1$, more preferably at least $1.35 \times P_1$, more preferably at least $1.4 \times P_1$.

Where the porous carbon framework comprises a relatively higher ratio of mesopores to micropores, (for instance where $\varphi_a$ is in the range from 0.2 to 0.5, or in the range from 0.3 to 0.5), the weight ratio of silicon to carbon may be higher still, for example at least $1.45 \times P_1$, more preferably at least $1.5 \times P_1$, more preferably at least $1.55 \times P_1$, more preferably at least $1.6 \times P_1$, more preferably at least $1.65 \times P_1$, more preferably at least $1.5 \times P_1$.

The minimum weight ratio of silicon to the porous carbon framework is correlated to the total micropore and mesopore volume by the requirement that the weight ratio of silicon to the porous carbon framework in the composite particles is at least $1 \times P_1$. More preferably, the weight ratio of silicon to the porous carbon framework has at least the value given by $[\varphi_b+0.75] \times P_1$, more preferably at least the value given by $[\varphi_b+0.8] \times P_1$, more preferably at least the value given by $[\varphi_b+0.9] \times P_1$, more preferably at least the value given by $[\varphi_b+1] \times P_1$, more preferably at least the value given by $[\varphi_b+1.1] \times P_1$ (with the proviso that said value is at least $1 \times P_1$).

Thus, in the case that the mesopore fraction ($\varphi_b$) has a higher value, the minimum amount of silicon in composite particles 2 is also higher. This correlation between mesopore fraction and the minimum weight ratio of silicon to the porous carbon framework ensures that porous carbon frameworks having higher mesopore fractions are occupied by silicon to a higher extent, thus optimizing the volumetric capacity of composite particles 2. Ensuring that porous carbon frameworks having higher mesopore fractions have a higher minimum silicon loading also reduces the possibility that larger micropores will be partially occupied by silicon, thus reducing the silicon surface area that is exposed to the electrolyte and thereby limiting undesirable SEI formation.

The maximum weight ratio of silicon to the porous carbon framework is also correlated to the total pore volume by the requirement that the weight ratio of silicon to the porous carbon framework in the composite particles is no more than $2.2 \times P_1$. More preferably, the weight ratio of silicon to the porous carbon framework is no more than the value given by $[\varphi_b+1.6] \times P_1$, more preferably no more than the value given by $[\varphi_b+1.5] \times P_1$ (with the proviso that said value is no more than $1.9 \times P_1$).

The correlation between mesopore fraction and the maximum weight ratio of porous carbon framework ensures that that porous carbon frameworks having higher micropore fractions are not excessively filled by silicon. It may be more difficult to achieve very high ratios of silicon in the event that the porous carbon framework is more highly microporous due to the potential for walls or caps to form which enclose occupied pore volume. In addition, in the case that the porous carbon framework is more highly microporous, diffusion of lithium through very fine silicon structures becomes rate limited, reducing the rate capacity of the particulate material. Accordingly, controlling the upper limit of the silicon ratio ensures a degree of electrolyte access to the internal pore volume of the porous carbon framework, facilitating transport of lithium ions to the silicon domains.

Preferably the silicon mass in composite particles 2 is located substantially or entirely within the pores of the porous carbon framework in the form of the nanoscale silicon domains that are described above. For example, it is preferred that at least 90 wt %, more preferably at least 95 wt %, more preferably at least 98 wt %, more preferably at least 99 wt % of the silicon mass in composite particles 2 is located within the internal pore volume of the porous carbon framework such that there is no or very little silicon located on the external surface of the composite particles.

Composite particles 2 may have a $D_{50}$ particle diameter in the range of 0.5 to 20 μm. Preferably, the $D_{50}$ particle diameter is at least 1 μm, more preferably at least 2 μm, for example at least 3 μm, or at least 4 μm, or at least 5 μm. Preferably, the $D_{50}$ particle diameter of composite particles 2 is no more than 18 μm, more preferably no more than 16 μm, more preferably no more than 14 μm, more preferably no more than 12 μm, more preferably no more than 10 μm, for example no more than 9 μm, or no more than 8 μm.

For instance, composite particles 2 may have a $D_{50}$ particle diameter in the range of 1 to 12 μm, or from 1 to 10 μm, or from 2 to 10 μm, or from 3 to 10 μm, or from 3 to 8 μm. Particles within these size ranges and having porosity and a pore diameter distribution as set out herein are ideally suited for use in hybrid anodes for metal-ion batteries, due to their dispersibility in slurries, their structural robustness, their capacity retention over repeated charge-discharge cycles, and their ability to occupy the interparticle void spaces between conventional graphite particles used in the electrode of metal-ion batteries.

The $D_{10}$ particle diameter of composite particles 2 is preferably at least 0.2 μm, or at least 0.5 μm, or at least 0.8 μm, or at least 1 μm, or at least 1.5 μm, or at least 2 μm. By maintaining the $D_{10}$ particle diameter at 0.2 μm or more, the potential for undesirable agglomeration of sub-micron sized particles is reduced, resulting in improved dispersibility of the particulate material and improved capacity retention.

The $D_{90}$ particle diameter of composite particles 2 is preferably no more than 40 μm, or no more than 30 μm, or no more than 20 μm, or no more than 15 μm, or no more than 12 μm, or no more than 10 μm. The presence of very large particles results in non-uniform forming packing of the particles in electrode active layers, thus disrupting the formation of dense electrode layers, particularly electrode layers having a thickness in the conventional range of 20 to 50 μm. Therefore, it is preferred that the $D_{90}$ particle diameter is no more than 20 μm, and more preferably lower still.

Composite particles 2 preferably have a BET surface area of no more than 30 m$^2$/g, or no more than 25 m$^2$/g, or no more than 20 m$^2$/g, or no more than 15 m$^2$/g, or no more than 10 m$^2$/g. The BET surface area is preferably at least 0.1 m$^2$/g, or at least 1 m$^2$/g, or at least 2 m$^2$/g, or at least 5 m$^2$/g. For instance, the BET surface area may be in the range of 1 to 25 m$^2$/g, more preferably in the range of 2 to 15 m$^2$/g.

Composite Particles 3

Composite particles 3 produced by the process of the invention comprise:
(a) a porous carbon framework comprising micropores and/or mesopores, wherein the micropores and mesopores have a total pore volume as measured by gas adsorption of at least 0.7 cm$^3$/g, wherein the PD$_{50}$ pore diameter as measured by gas adsorption is no more than 2 nm; and
(b) an electroactive material located within the micropores and/or mesopores of the porous carbon framework;
wherein the composite particles have a $D_{90}$ particle diameter of no more than 10 μm.

Composite particles 3 may be produced using porous carbon frameworks 3 as the starting material. Therefore, the pore structure of the porous carbon frameworks 3 may be present in composite particles 3.

Composite particles 3 relate to a particulate material in which the porous carbon framework has relatively high total volume of micropores and mesopores, with pores having a diameter of no more than 2 nm constituting at least 50% of the total pore volume. This pore structure may be derived from porous carbon frameworks 3. Composite particles 3 have a particle size distribution that is heavily weighted towards particles with diameters of no more than 10 μm. It has been found that the combination of small particles size together with a highly divided pore volume provides an electroactive material with high resistance to mechanical degradation during electrode manufacture. The high microporosity of the porous carbon framework results in very fine pore walls, and without being bound by theory, it is believed that these very fine pore walls are able to deform elastically with reduced rate of fracture such that the fracture resistance of the framework under compressive stress is very high. The controlled pore size distribution contributes additionally to particle strength as well as enabling improved close packing of the composite particles in electrode active layers, thereby reducing the need for excessive calendering pressure.

The $D_{90}$ particle diameter of composite particles 3 is preferably no more than 9.5 μm, or no more than 9 μm, or no more than 8.5 μm, or no more than 8 μm, or no more than 7.5 μm, or no more than 7 μm, or no more than 6.5 μm, or no more than 6 μm, or no more than 5.5 μm, or no more than 5 μm, or no more than 4.5 μm, or no more than 4 μm.

Composite particles 3 preferably have a $D_{50}$ particle diameter in the range of 0.5 to 7 μm. Optionally, the $D_{50}$ particle diameter may be at least 1 μm, or at least 1.5 μm, or at least 2 μm, or at least 2.5 μm, or at least 3 μm.

Optionally the $D_{50}$ particle diameter may be no more than 6.5 μm, or no more than 6 μm, or no more than 5.5 μm, or no more than 5 μm, or no more than 4.5 μm, or no more than 4 μm, or no more than 3.5 μm.

For instance, composite particles 3 may have a $D_{50}$ particle diameter in the range of 1 to 6.5 μm, or from 1.5 to 6 μm, or from 2 to 5.5 μm, or from 2.5 to 5 μm, or from 3 to 4.5 μm.

Particles within these size ranges and having porosity and a pore diameter distribution as set out herein are ideally suited for use in anodes for metal-ion batteries, due to their dispersibility in slurries, their structural robustness, their capacity retention over repeated charge-discharge cycles, and their suitability for forming dense electrode layers of uniform thickness without structural degradation.

The $D_{10}$ particle diameter of composite particles 3 is preferably at least 0.2 μm, or at least 0.5 μm, or at least 0.8 μm, or at least 1 μm, or at least 1.5 μm, or at least 2 μm. By maintaining the $D_{10}$ particle diameter at 0.2 μm or more, the potential for undesirable agglomeration of sub-micron sized particles is reduced, resulting in improved dispersibility of the particulate material and improved capacity retention.

The $D_{99}$ particle diameter of composite particles 3 is preferably no more than 25 μm, or no more than 20 μm, or no more than 18 μm, or no more than 15 μm, or no more than 12 μm, or no more than 10 μm, or no more than 9 μm, or no more than 8 μm, or no more than 7 μm, or no more than 6 μm, or no more than 5 μm.

The particle size preferably has a positive skew in the volume-based distribution, i.e. such that the volume based distribution is asymmetric with a longer tail on the right hand side. A positive skew in the volume-based particle size distribution is advantageous since it provides a denser electrode since the natural packing factor will be higher than if all particles are the same size, thereby reducing the need for calendering or other physical densification processes.

Composite particles 3 preferably have a narrow size distribution span. For instance, the particle size distribution span (defined as $(D_{90}-D_{10})/D_{50}$) is preferably no more than 8.

The amount of electroactive material in composite particles 3 is preferably selected such that no more than about 55% of the internal pore volume of the porous carbon framework is occupied by the electroactive material (in the uncharged state). This is referred to herein as the "fill factor" of the electroactive material within the porous carbon framework. Preferably, the electroactive material occupies from about 25% to about 45% of the internal pore volume of the porous carbon framework, more preferably from about 25% to about 40% of the internal pore volume of the porous carbon framework. Within these preferred ranges, the pore volume of the porous carbon framework is effective to accommodate expansion of the electroactive material during charging and discharging, but avoids excess pore volume which does not contribute to the volumetric capacity of the particulate material. However, the amount of electroactive material is also not so high as to impede effective lithiation due to inadequate metal-ion diffusion rates or due to inadequate expansion volume resulting in mechanical resistance to lithiation.

Where the electroactive material is silicon, the weight ratio of silicon to the porous carbon framework is preferably $[0.5 \times P_1$ to $1.3 \times P_1]$:1. This corresponds to a volume of silicon in the composite particles that is equivalent to approximately 20%-55% of the total micropore/mesopore volume of the porous carbon framework. More preferably, the weight ratio of silicon to the porous carbon framework is in the range of $[0.55 \times P_1$ to $1.1 \times P_1]$:1, or in the range of $[0.6 \times P_1$ to $1.1 \times P_1]$:1, or in the range of $[0.6 \times P_1$ to $1 \times P_1]$:1, or in the range of $[0.6 \times P_1$ to $0.95 \times P_1]$:1, or in the range of $[0.6 \times P_1$ to $0.9 \times P_1]$:1, or in the range of $[0.65 \times P_1$ to $0.9 \times P_1]$:1, or in the range of $[0.65 \times P_1$ to $0.85 \times P_1]$:1, or in the range of $[0.65 \times P_1$ to $0.8 \times P_1]$:1, or in the range of $[0.7 \times P_1$ to $0.8 \times P_1]$:1.

Composite particles 3 preferably have a BET surface area of less than 150 m²/g, or no more than 100 m²/g, or no more than 80 m²/g, or no more than 60 m²/g, or no more than 40 m²/g, or no more than 30 m²/g, or no more than 25 m²/g, or no more than 20 m²/g, or no more than 15 m²/g, or no more than 10 m²/g. The BET surface area is preferably at least 0.1 m²/g, or at least 1 m²/g, or at least 2 m²/g, or at least 5 m²/g. For instance, the BET surface area may be in the range of 1 to 25 m²/g, more preferably in the range of 2 to 15 m²/g.

Carbon Coating

The process of the invention may optionally include a further step comprising depositing a conductive coating, preferably a carbon-based coating, on the composite particles. Suitably a conductive carbon-based coating may be obtained by a chemical vapor deposition (CVD) method. CVD is a well-known methodology in the art and comprises the thermal decomposition of a volatile carbon-containing gas (e.g. ethylene) onto the surface of the particulate material. Alternatively, the carbon-based coating may be formed by depositing a solution of a carbon-containing compound onto the surface of the particulate material followed by pyrolysis. The conductive coating (such as a carbon-based coating) is sufficiently permeable to allow lithium access to the interior of the composite particles without excessive resistance, so as not to reduce the rate performance of the composite particles. For instance, the thickness of the conductive coating may suitably be in the range of 2 to 30 nm. Optionally, the conductive coating may be porous and/or may only cover partially the surface of the composite particles.

A conductive coating has the advantages that it further reduces the BET surface area of the composite particles by smoothing any surface defects and by filling any remaining surface microporosity, thereby further reducing first cycle loss. In addition, a conductive coating improves the electronic conductivity of the surface of the composite particles, reducing the need for conductive additives in the electrode composition, and also creates an optimum surface for the formation of a stable SEI layer, resulting in improved capacity retention on cycling.

Preferably the BET surface area of the composite particles after depositing the conductive coating is less than 50, less than 30, less than 20, more preferably less than 10, or less than 5 m²/g.

End-Use of Product

The process of the invention may optionally include a further step of forming an electrode composition comprising the composite particles (optionally wherein the composite particles have been coated with a conductive carbon coating). The electrode composition may comprise at least one other component selected from: (i) a binder; (ii) a conductive additive; and (iii) an additional particulate electroactive material.

The process of the invention may optionally include a further step of forming a slurry comprising the composite particles (optionally wherein the composite particles have been coated with a conductive carbon coating) and a solvent.

Product-by-Process

The invention also provides a particulate material comprising composite particles obtainable by the process of the invention. The nanostructure of the electroactive material deposited by the CVI process of the invention is different to the nanostructure of an electroactive material deposited by other means. Moreover, because the composite particles arise from a CVI process and a subsequent comminution process they can be distinguished from particles of a similar size prepared without the subsequent commination step. For instance, the communion step gives rise to fracture surfaces which may be observed via microscopy. Accordingly, the composite particles obtainable from the process of the invention can be distinguished from composite particles obtained by other means.

Example 1

A fluidized bed reactor was fabricated with a 0.95 cm (⅜") stainless steel gas inlet and 60 mm outside diameter (O.D.) tubular section with length of 520 mm. The stainless steel expanded head was fabricated with an O.D. of 99.9 mm. The reactor was suspended from a frame and a vertically oriented tube furnace was position such that the hot zone ran from the conical section to % of the length of the cylindrical section (approx. 380 mm long). A flanged lid was built for the top with tapped ports for thermocouples, gas outlet and powder dosing. The furnace was dosed with 50 g of mesoporous carbon with the following properties: (BET surface area of 1650 m²/g; total pore volume $P_1$ of 1.86 cm³/g; micropore volume of 0.24 cm³/g; $\varphi_a=13\%$; $D_{50}$ of 119 μm). Initially, the minimum fluidization velocity was determined with a cold-flow pressure-drop test ramping the inert gas flow rate between 0 and 4 L/min. Once minimum fluidizing velocity was determined, the inert gas flow rate was held constant at or above the minimum fluidizing velocity. In this case nitrogen was used as the inert fluidization gas. The furnace was ramped to the desired reaction temperature under constant, continuously fluidizing gas flow rates. After stabilizing at a target temperature between 450 to 500° C. the atmosphere was switched from pure nitrogen to 1.25 vol % monosilane. The reaction progress was monitored by measuring pressure drop and furnace temperature difference between top and bottom. The flow rate was adjusted throughout the run to maintain a pressure drop consistent with continued fluidization (determined from cold-flow and specific to the porous carbon concerned) and minimum temperature difference between the top and bottom of the bed; a delta T of less than 40° C. was maintained in this example. The reaction was run for a pre-chosen period, in this specific case approximately 12 hours reaction time. Once reaction time was complete, the furnace atmosphere was switched to pure nitrogen whilst maintaining fluidization, this purge lasted 30 minutes. After this the furnace was ramped to ambient temperature over several hours. On reaching ambient temperature, the furnace atmosphere was switched to air gradually over a period of hours. In this specific case, the furnace atmosphere was switched to 4:1 nitrogen:air volume ratio for 40 minutes. An exotherm of 10° C. was observed and allowed to stabilize. The furnace atmosphere was then switched to 3:1 nitrogen to air volume ratio for 20 mins. A small exotherm of around 2° C. was observed and allowed to stabilize during this period. The furnace atmosphere was then adjusted to 1:1 nitrogen:air volume ratio and held for 40 mins, no exotherm was observed. After this time the furnace atmosphere was switched to 1:3 nitrogen:air volume ratio and held for 30 minutes. The furnace atmosphere was switched fully to air and held for 3 hours. The sample was finally unloaded through the gas feed tube at the bottom as a grey free flowing powder weighing approximately 65 g. The BET surface area was 400 m$^2$/g, and the $D_{50}$ particle diameter was 161 μm. The product was then jet milled using a Hosokawa Alpine 50 AS spiral jet mill, as follows. The reclaimed FBR infiltrated product (the intermediate particles) was added to the feed tray of a Retsch DR100 vibratory powder feeder. The powder feeder was set to feed at a constant rate of 1 g/min. The feed and grinding gasses were nitrogen. The feed gas pressure was set at 300 kPa and the grinding gas pressure was set at 400 kPa. The comminuted material was caught on a bag filter and reclaimed under a continuous passivating flow of nitrogen gas to provide the composite particles. The composite particles had a Si:C weight ratio of 1.58:1 and a silicon content of 63 wt %, measured as described above.

| Material | $D_{50}$ |
|---|---|
| Mesoporous carbon starting material | 119 μm |
| Product after deposition of Si into mesoporous carbon | 161 μm |
| Product after jet milling | 2 μm |

The invention claimed is:

1. A process for preparing composite particles, the process comprising:
   (a) providing particulate porous carbon frameworks comprising micropores and/or mesopores, wherein the porous carbon frameworks have a $D_{50}$ particle diameter of at least 50 μm;
   (b) depositing an electroactive material selected from silicon and alloys thereof into the micropores and/or mesopores of the porous carbon frameworks using a chemical vapour infiltration process in a fluidized bed reactor, to provide intermediate particles; and
   (c) comminuting the intermediate particles to provide said composite particles.

2. The process according to claim 1, wherein the electroactive material is silicon.

3. The process according to claim 1, wherein the intermediate particles and the composite particles comprise a plurality of nanoscale domains of the electroactive material located within the micropores and/or mesopores of the porous carbon frameworks.

4. The process according to claim 1, wherein the chemical vapour infiltration process is performed at a temperature in the range of 200 to 1250° C.

5. The process according to claim 1, further comprising a step of cooling the intermediate particles to a temperature of below 100° C. before comminuting the intermediate particles.

6. The process according to claim 1, further comprising a step of passivating the intermediate particles before comminuting the intermediate particles, wherein the passivating is performed in an inert gas or in an environment where the oxygen concentration is less than 10 vol % oxygen.

7. The process according to claim 1, wherein the comminuting is performed by a jet mill.

8. The process according to claim 1, wherein the step of comminuting the intermediate particles is performed in an environment where the oxygen concentration is less than 10 vol % oxygen.

9. The process according to claim 1, wherein the micropores and/or mesopores of the porous carbon frameworks have a total pore volume as measured by gas adsorption of $P_1$ cm$^3$/g, wherein $P_1$ has a value of at least 0.4.

10. The process according to claim 9, wherein $P_1$ has a value of at least 0.5.

11. The process according to claim 1, wherein the micropores and/or mesopores of the porous carbon frameworks have a total pore volume as measured by gas adsorption of $P_1$ cm$^3$/g, wherein $P_1$ has a value of up to 2.5.

12. The process according to claim 11, wherein the micropores and/or mesopores of the porous carbon frameworks have a total pore volume as measured by gas adsorption of $P_1$ cm$^3$/g, wherein the value of $P_1$ is in the range of 0.6 to 2.5.

13. The process according to claim 1, wherein the porous carbon frameworks have a $D_{50}$ particle diameter of at least 60 μm.

14. The process according to claim 1, wherein the porous carbon frameworks have a $D_{50}$ particle diameter of no more than 1000 μm.

15. The process according to claim 1, wherein the porous carbon frameworks have a $D_{10}$ particle diameter of at least 30 μm.

16. The process according to claim 1, wherein the porous carbon frameworks have a $D_{90}$ particle diameter of no more than 1500 μm.

17. The process according to claim 1, wherein the porous carbon frameworks have a $D_{98}$ particle diameter of no more than 1550 μm.

18. The process according to claim 1, wherein the porous carbon frameworks have a BET surface area of at least 750 m$^2$/g.

19. The process according to claim 1, wherein the porous carbon frameworks have a BET surface area of no more than 4000 m$^2$/g.

20. The process according to claim 1, wherein the $PD_{50}$ pore diameter of the porous carbon frameworks is no more than 5 nm.

21. The process according to claim 1, wherein the composite particles have a $D_{50}$ particle diameter in the range of 0.5 to 50 μm.

22. The process according to claim 21, wherein the composite particles have a $D_{50}$ particle diameter of at least 1 μm.

23. The process according to claim 21, wherein the composite particles have a $D_{50}$ particle diameter of no more than 40 μm.

24. The process according to claim 1, wherein the composite particles have a $D_{10}$ particle diameter of at least 0.2 μm.

25. The process according to claim 1, wherein the composite particles have a $D_{90}$ particle diameter of no more than 80 μm.

26. The process according to claim 1, wherein the electroactive material is silicon, wherein the pore volume of the composite particles is expressed as $P_1$ cm$^3$/g, and wherein the weight ratio, for the composite particles, of silicon to the porous carbon framework in the composite particles is in the range of $[0.5 \times P_1$ to $2.2 \times P_1]:1$.

27. The process according to claim 1, wherein the electroactive material is silicon, and wherein the composite particles comprise 30 to 80 wt % silicon.

28. The process according to claim 1, wherein the composite particles comprise no more than 15 wt % oxygen.

* * * * *